United States Patent
Sekine et al.

(10) Patent No.: US 8,766,312 B2
(45) Date of Patent: Jul. 1, 2014

(54) LIGHT-EMITTING DEVICE COMPRISING VERTICAL CONDUCTORS AND THROUGH ELECTRODES AND METHOD FOR MANUFACTURING THE SAME

(75) Inventors: Shigenobu Sekine, Tokyo (JP); Yurina Sekine, Tokyo (JP); Yoshiharu Kuwana, Tokyo (JP); Kazutoshi Kamibayashi, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 13/276,475

(22) Filed: Oct. 19, 2011

(65) Prior Publication Data
US 2012/0091481 A1    Apr. 19, 2012

(30) Foreign Application Priority Data

Oct. 19, 2010   (JP) ................................. 2010-234459

(51) Int. Cl.
*H01L 33/00*   (2010.01)

(52) U.S. Cl.
USPC ................... 257/99; 257/88; 257/91; 257/94; 257/96; 257/97; 257/100; 257/103; 257/E33.062; 257/E33.063; 257/E33.065

(58) Field of Classification Search
CPC ....... H01L 33/36; H01L 33/38; H01L 33/387; H01L 33/40
USPC ............. 257/88, 91, 94, 96, 97, 99, 103, 100, 257/E33.062, E33.063, E33.065
See application file for complete search history.

(56) References Cited

U.S. PATENT DOCUMENTS

| 3,517,957 | A | * | 6/1970 | Vail et al. ........................ 403/42 |
| 4,045,536 | A | * | 8/1977 | Wallace ......................... 264/327 |
| 7,179,670 | B2 | * | 2/2007 | Shelton et al. .................. 438/26 |
| 7,417,220 | B2 | * | 8/2008 | Suehiro et al. ................ 250/239 |

(Continued)

FOREIGN PATENT DOCUMENTS

| EP | 2197051 A2 | 6/2010 |
| JP | 63-086578 A | 4/1988 |

(Continued)

OTHER PUBLICATIONS

Taiwanese Office Action dated Sep. 18, 2012, issued in corresponding Taiwanese patent application No. 100137620, w/ Japanese translation.

(Continued)

*Primary Examiner* — Jay C Kim
(74) *Attorney, Agent, or Firm* — Westerman, Hattori, Daniels & Adrian, LLP

(57) ABSTRACT

A light-emitting device includes a light-emitting element and a support substrate. The light-emitting element has an insulating layer and first and second vertical conductors passing through the insulating layer. The support substrate has a substrate part and first and second through electrodes and is disposed on the insulating layer. The first through electrode passes through the substrate part with one end connected to an opposing end of the first vertical conductor, while the second through electrode passes through the substrate part with one end connected to an opposing end of the second vertical conductor. The opposing ends of the first and second vertical conductors are projected from a surface of the insulating layer and connected to the ends of the first and second through electrode inside the support substrate.

1 Claim, 21 Drawing Sheets

(56) References Cited

U.S. PATENT DOCUMENTS

| | | | |
|---|---|---|---|
| 7,470,987 B2 * | 12/2008 | Tsuchiya et al. | 257/753 |
| 7,736,945 B2 * | 6/2010 | Schiaffino et al. | 438/106 |
| 7,842,958 B1 * | 11/2010 | Sekine et al. | 257/88 |
| 8,129,743 B2 * | 3/2012 | Suehiro et al. | 257/100 |
| 8,148,183 B2 * | 4/2012 | Hamasaki et al. | 438/33 |
| 8,278,676 B2 * | 10/2012 | Kojima et al. | 257/98 |
| 8,288,843 B2 * | 10/2012 | Kojima et al. | 257/620 |
| 8,350,285 B2 * | 1/2013 | Sugizaki et al. | 257/99 |
| 8,470,621 B2 * | 6/2013 | Kuo et al. | 438/28 |
| 8,569,772 B2 * | 10/2013 | Kim | 257/82 |
| 8,581,291 B2 * | 11/2013 | Shimokawa et al. | 257/99 |
| 2010/0148198 A1 | 6/2010 | Sugizaki et al. | |
| 2010/0230711 A1 | 9/2010 | Kuo et al. | |

FOREIGN PATENT DOCUMENTS

| | | |
|---|---|---|
| JP | 2003-046124 A | 2/2003 |
| JP | 2006-005067 A | 1/2006 |
| JP | 2006-114820 A | 4/2006 |
| JP | 2007-123446 A | 5/2007 |
| JP | 2007-329502 A | 12/2007 |
| JP | 2008-041866 A | 2/2008 |
| JP | 2008-218674 A | 9/2008 |
| JP | 2009-134965 A | 6/2009 |
| JP | 2009-176966 A | 8/2009 |
| JP | 2009-206216 A | 9/2009 |
| JP | 2010-056458 A | 3/2010 |
| JP | 4454689 B1 | 4/2010 |
| JP | 2010-103186 A | 5/2010 |
| JP | 2010-141176 A | 6/2010 |
| TW | 201031033 A1 | 8/2010 |
| TW | 201032349 A1 | 9/2010 |

OTHER PUBLICATIONS

Taiwanese Office Action dated Jan. 29, 2013, issued in corresponding Taiwanese Patent Application No. 100137620.

European Search Report dated Jul. 26, 2013, issued in corresponding European Patent Application No. 11250860.1 (3 pages).

* cited by examiner

LIGHT-EMITTING DEVICE COMPRISING VERTICAL CONDUCTORS AND THROUGH ELECTRODES AND METHOD FOR MANUFACTURING THE SAME

BACKGROUND OF THE INVENTION

1. Field of the Invention

The present invention relates to a light-emitting device and a method for manufacturing the same.

2. Description of the Related Art

Light-emitting devices using a light-emitting diode have the advantages of energy conservation and long service life and have come to attract attention as a light source of a lighting apparatus, a color image display device, a backlight of a liquid crystal panel, a traffic light or the like.

Regarding such a light-emitting device, for example, Japanese Unexamined Patent Application Publication No. 2006-114820 discloses a light-emitting element in which a transparent crystal substrate, a pair of semiconductor layers comprising p-type and n-type nitride semiconductors, semiconductor surface electrodes for supplying a current to the pair of semiconductor layers and an insulating substrate are stacked in order. The insulating substrate has vertical conductors. The vertical conductor is formed within a vertical hole passing through the insulating substrate in a thickness direction by a plating process or a process of filling a conductive paste such as solder, whereby the semiconductor surface electrodes are electrically connected to mounting surface electrodes formed on the other side of the insulating substrate.

In the meantime, since the mounting surface electrodes are provided on a surface of the insulating substrate opposite from its light-emitting surface, the light-emitting element disclosed in Japanese Unexamined Patent Application Publication No. 2006-114820 has to be handled in the same manner as elements to be mounted on a surface of a printed circuit board.

However, since such a light-emitting element has an ultrathin structure typically having a thickness of about 20 µm, it is difficult to handle the light-emitting element like other elements to be mounted on a surface of a printed circuit board as in Japanese Unexamined Patent Application Publication No. 2006-114820. If the light-emitting element is broken by failure of handling in surface mounting, for example, the lighting apparatus or the like becomes less reliable.

When the vertical conductor is formed by a plating process, as disclosed in Japanese Unexamined Patent Application Publication No. 2006-114820, moreover, since the plating process inevitably needs a certain period of time, its production efficiency becomes extremely low.

On the other hand, when the vertical conductor is formed by a process of filling a conductive paste such as solder, the conductive paste filled into the vertical hole inevitably shrinks upon solidification to create a shrinkage cavity in the vertical conductor. Such a shrinkage cavity leads to increasing electrical resistance, deteriorating high-frequency characteristics and lowering reliability.

SUMMARY OF THE INVENTION

It is an object of the present invention to provide a highly reliable surface light-emitting, light-emitting device and a method for manufacturing the light-emitting device.

It is another object of the present invention to provide an easily manufactured light-emitting device and a method for manufacturing the light-emitting device.

In order to achieve the above object, a light-emitting device according to the present invention comprises a light-emitting element and a support substrate. The light-emitting element has a transparent crystal substrate, a semiconductor layer, semiconductor surface electrodes, an insulating layer and vertical conductors. The transparent crystal substrate has a light-emitting surface at one side thereof, while the semiconductor layer has a multilayer structure having a p-type semiconductor layer and an n-type semiconductor layer and is disposed on the other side of the transparent crystal substrate opposite from the light-emitting surface. Of the p-type semiconductor layer and the n-type semiconductor layer, one semiconductor layer close to the transparent crystal substrate has a portion not overlapping the other semiconductor layer.

The semiconductor surface electrodes include a first semiconductor surface electrode and a second semiconductor surface electrode, wherein the first semiconductor surface electrode is disposed on a surface of the non-overlapping portion of the one semiconductor layer, while the second semiconductor surface electrode is disposed on a surface of the other semiconductor layer directed to the same direction as the surface having the first semiconductor surface electrode. The insulating layer covers the semiconductor layer.

The vertical conductors are expansion metallic bodies having a metallic component that expands upon solidification and include a first vertical conductor and a second vertical conductor. The first vertical conductor passes through the insulating layer and is connected to the first semiconductor surface electrode, while the second vertical conductor passes through the insulating layer and is connected to the second semiconductor surface electrode.

The support substrate has a substrate part and through electrodes and is disposed on the insulating layer. The through electrodes are expansion metallic bodies having a metallic component that expands upon solidification and include a first through electrode and a second through electrode. The first through electrode passes through the substrate part and is connected to the first vertical conductor, while the second through electrode passes through the substrate part and is connected to the second vertical conductor.

As described above, the light-emitting device according to the present invention comprises the light-emitting element and the support substrate, and the support substrate is disposed on the light-emitting element. With this structure, since the ultrathin light-emitting element is reinforced with the support substrate, handleability during the production process can be greatly improved to enhance productivity and production efficiency.

Moreover, the light-emitting element and the support substrate can be prepared in separate processes and then integrated such as by a process of bonding the support substrate to the insulating layer of the light-emitting element, or otherwise a filling process for the vertical conductor and the through electrode can be performed at one time with the support substrate being bonded to the light-emitting element. Therefore, it can be manufactured efficiently according to an optimal manufacturing method suitable for production facilities.

Furthermore, since the support substrate serves as an interposer, a rational feeder circuit for the light-emitting element can be realized by using the support substrate.

By using the support substrate, still furthermore, the thickness of the insulating layer in the light-emitting element can be reduced to facilitate a drilling process for the insulating layer and a subsequent vertical conductor formation process.

The light-emitting element has the transparent crystal substrate and the semiconductor layer, wherein the transparent crystal substrate has the light-emitting surface at one side thereof, while the semiconductor layer is disposed on the other side of the transparent crystal substrate opposite from the light-emitting surface. This structure forms the basis for realizing a structure in which none of electrodes for the semiconductor layer, i.e., neither a p-side electrode nor an n-side electrode appears on the light-emitting surface.

In the present invention, of the p-type and n-type semiconductor layers of the semiconductor layer, one semiconductor layer close to the transparent crystal substrate has a portion not overlapping the other semiconductor layer as a specific structure for realizing the structure in which none of electrodes for the semiconductor layer appears on the light-emitting surface.

The first semiconductor surface electrode, which is either the p-side electrode or the n-side electrode, is disposed on a surface of the non-overlapping portion of one semiconductor layer, while the second semiconductor surface electrode is disposed on a surface of the other semiconductor layer directed to the same direction as the surface having the first semiconductor surface electrode. Accordingly a current is supplied to the semiconductor layer from a side opposite from the side having the transparent crystal substrate. The semiconductor layer is covered with the insulating layer and therefore protected by the insulating layer.

The light-emitting element has the first vertical conductor and the second vertical conductor. The first vertical conductor passes through the insulating layer and is connected to the first semiconductor surface electrode, while the second vertical conductor passes through the insulating layer and is connected to the second semiconductor surface electrode. On the other hand, the support substrate has the first through electrode and the second through electrode, wherein the first through electrode passes through the substrate part and is connected to the first vertical conductor, while the second through electrode passes through the substrate part and is connected to the second vertical conductor.

To the first and second semiconductor surface electrodes for the semiconductor layer, accordingly, a current is supplied from a side opposite from the side having the transparent crystal substrate through a circuit of the first through electrode and the first vertical conductor and a circuit of the second through electrode and the second vertical conductor, thereby realizing the structure in which none of electrodes for the semiconductor layer appears on the light-emitting surface.

The first and second vertical conductors are expansion metallic bodies. The expansion metallic body is formed by a molten metal filling process such that a molten metal is poured into a vertical hole formed in the insulating layer and then solidified. The molten metal poured into the vertical hole is cooled and solidified while being subjected to a mechanical force such as a pressing pressure using a pressing plate, an injection pressure or a rolling pressure, whereby vertical conductors having a compact structure free from any cavity, void or hollow can be formed efficiently in a short time.

The expansion metallic body forming the first and second vertical conductors contains a metallic component that expands in volume upon solidification (solidification expansion metallic component). Its specific example is Bi (bismuth). By adding a solidification expansion metallic component such as Bi, compact vertical conductors free from any void or hollow can be formed within the vertical hole because of the volume expansion property upon solidification. When using the molten metal filling process, the insulating layer heated by the molten metal shrinks with a decrease in temperature of the molten metal. At this time, if the molten metal also shrinks in volume with a decrease in temperature, a void or hollow will be created between the inner wall surface of the vertical hole and the expansion metallic body. In the present invention, such a void or hollow will never be created because the molten metal contains a solidification expansion metallic component such as Bi. This makes it possible to form high-quality vertical conductors with excellent electrical properties.

The first and second through electrodes of the support substrate are also expansion metallic bodies. This expansion metallic body is also formed by a molten metal filling process similar to that used for the vertical conductors, and therefore through electrodes having a compact structure free from any cavity, void or hollow can be formed efficiently in a short time.

The expansion metallic body forming the first and second through electrodes also contains a solidification expansion metallic component. A specific example of the solidification expansion metallic component and its effect are the same as described above. Because of the volume expansion property of the solidification expansion metallic component, compact through electrodes free from any void or hollow can be formed within a through hole.

The light-emitting device according to the present invention may have a single or a plurality of light-emitting elements. In the case of having a plurality of light-emitting elements, there can be realized a surface light-emitting device having a light-emission amount based on the number of light-emitting elements.

In the case of having a plurality of light-emitting elements, the light-emitting elements are preferably separated from each other by a separation groove extending in the transparent crystal substrate, the semiconductor layer and the insulating layer. This is because the individual light-emitting elements can emit light in an electrically stable state. In this case, preferably, the support substrate is shared by the light-emitting elements. This is because the structure can be simplified to facilitate its production. The support substrate may be a ceramic substrate or a resin substrate.

The first and second semiconductor surface electrodes preferably include an electrode film containing Au. Moreover, the second semiconductor surface electrode preferably includes a light reflective electrode film. With this, a light emitted from a junction area of the semiconductor layer can be reflected toward the transparent crystal substrate by the light reflective electrode film, thereby increasing a light-emission amount as seen from the light-emitting surface of the transparent crystal substrate.

The light-emitting surface of the transparent crystal substrate may have small irregularities. This enables the light-emitting surface of the transparent crystal substrate to diffuse or disperse light, achieving uniform surface light emission. Alternatively, a transparent optical component having small irregularities may be disposed on the light-emitting surface of the transparent crystal substrate. Also in this case, the same effects can be obtained. Furthermore, a fluorescent body may be disposed on the light-emitting surface of or inside the transparent crystal substrate.

The present invention also discloses a method for manufacturing the foregoing light-emitting device. To manufacture it, the semiconductor layer and the semiconductor surface electrodes are stacked on the other side of the transparent crystal substrate opposite from the light-emitting surface to prepare a laminate. Then, the semiconductor layer and the semiconductor surface electrodes of the laminate are subjected to patterning to form individual light-emitting elements. Then, a heat resistant resin is applied to cover all the light-emitting elements and hardened to form the insulating layer. Then, vertical holes leading to the semiconductor surface electrodes are drilled in the insulating layer. A molten metal containing a metallic component that expands upon solidification is filled into the vertical holes thus drilled and solidified to form the vertical conductors. Then, the support substrate having the through electrodes is bonded to the insulating layer to join together the vertical conductors and the through electrodes.

According to the present invention, as has been described above, the following effects can be obtained.
(a) To provide a highly reliable surface light-emitting, light-emitting device and a method for manufacturing the same.
(b) To provide an easily manufactured light-emitting device and a method for manufacturing the same.

The present invention will be more fully understood from the detailed description given hereinbelow and the accompanying drawings which are given by way of illustration only and thus not to be considered as limiting the present invention.

DESCRIPTION OF THE PREFERRED EMBODIMENTS

1. Light-Emitting Device

Figure 1:
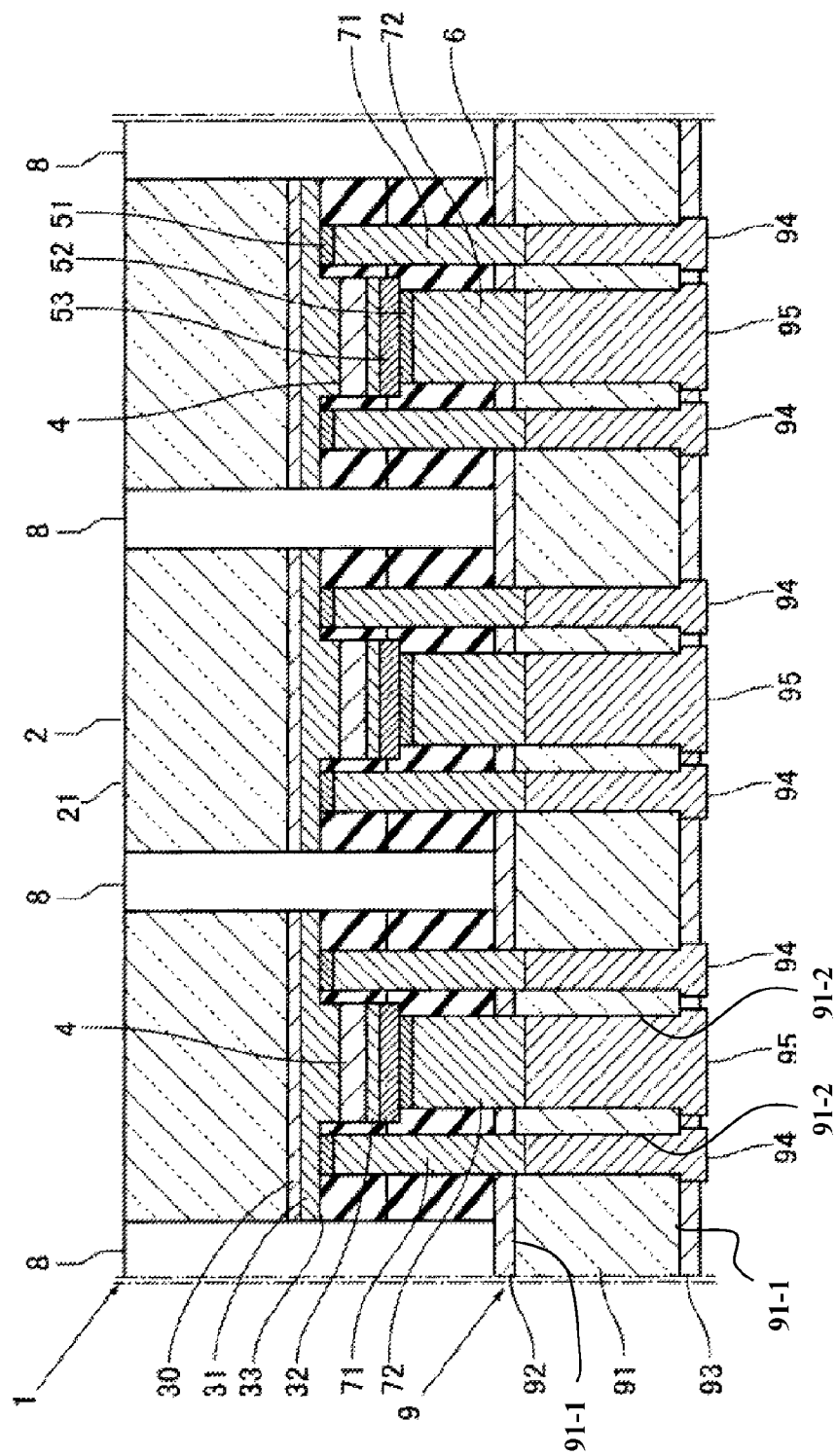
FIG. 1 is a partial sectional view of a light-emitting device according to one embodiment of the present invention.

Referring to FIG. 1, a light-emitting device according to the present invention comprises a light-emitting element 1 and a support substrate 9. The light-emitting element 1 is a light-emitting diode having a transparent crystal substrate 2, a semiconductor layer (31, 32), semiconductor surface electrodes (51, 52), an insulating layer 6 and vertical conductors (71, 72).

Typically, the transparent crystal substrate 2 comprises sapphire and its one side becomes a light-emitting surface 21. A buffer layer 30 lies on one side of the transparent crystal substrate 2 and the semiconductor layer (31, 32) is grown over the transparent crystal substrate 2 with the buffer layer 30 therebetween.

The semiconductor layer (31, 32) in the light-emitting element 1 is well-known in the art. It has a PN junction and typically comprises a III-V group compound semiconductor. However, it is not limited to the known art but can comprise any compound semiconductors that may be suggested in future.

In the present invention, the light-emitting element 1 may be any one of red, green, blue and orange light-emitting elements or a white light-emitting element. Semiconductor materials for constituting the semiconductor layer (31, 32) in such a light-emitting element 1 are well known in the art.

FIG. 1 shows an example of a GaN-based blue light-emitting element using a nitrogen (N)-based compound semiconductor. Referring to the figure, the semiconductor layer (31, 32) has a structure in which an n-type semiconductor layer 31, an active layer 4 and a p-type semiconductor layer 32 are stacked in the named order on the buffer layer 30 adhered to one side of the transparent crystal substrate 2 comprising sapphire. For example, the n-type semiconductor layer 31 is a Si-doped GaN layer, while the p-type semiconductor layer 32 is a Mg-doped GaN layer.

The active layer 4 has a multiple quantum well (MQW) structure such as of GaN—InGaN and may have an Al—GaN superlattice cap layer on one side which is in contact with the p-type semiconductor layer 32.

Of the p-type semiconductor layer and the n-type semiconductor layer, the n-type semiconductor layer 31 close to the transparent crystal substrate 2 has a portion 33 not overlapping the p-type semiconductor layer 32. The non-overlapping portion 33 is provided outside, e.g., at both sides of or around an active area comprising the n-type semiconductor layer 31, the active layer 4 and the p-type semiconductor layer 32. The surface of the non-overlapping portion 33 may be set back from the surface in contact with the active layer 4 in a stepped manner or may extend continuously and planarly from the surface in contact with the active layer 4.

The semiconductor surface electrodes (51, 52) include a first semiconductor surface electrode 51 and a second semiconductor surface electrode 52. The first semiconductor surface electrode 51 and the second semiconductor surface electrode 52 are thin-film electrodes containing Au (gold). The first semiconductor surface electrode 51 is disposed on the surface of the non-overlapping portion 33 of the n-type semiconductor layer 31. The non-overlapping portion 33 should be made as small as possible.

The second semiconductor surface electrode 52 is disposed on the surface of the p-type semiconductor layer 32 directed to the same direction as the surface having the first semiconductor surface electrode 51. In the embodiment, the second semiconductor surface electrode 52 includes a light reflective electrode film 53 as a part thereof. The light reflective electrode film 53 mainly comprises Ag or Al and is disposed on the p-type semiconductor layer 32, and the second semiconductor surface electrode 52 is disposed on the light reflective electrode film 53. With this, a light emitted from the active layer 4 between the n-type semiconductor layer 31 and the p-type semiconductor layer 32 can be reflected toward the transparent crystal substrate 2 by the light reflective electrode film 53, thereby increasing a light-emission amount as seen from the light-emitting surface 21 of the transparent crystal substrate 2.

The light reflective electrode film 53 preferably has a two-layer structure in which a secondary reflective electrode film mainly comprising Cr is disposed on the reflective electrode film mainly comprising Ag or Al on a side opposite from the p-type semiconductor layer 32. With this secondary reflective electrode film, light reflection efficiency can be further improved.

The insulating layer 6 covers the active area comprising the semiconductor layers (31, 32) and the active layer 4. The insulating layer 6 comprises a heat resistant insulating resin such as heat resistant epoxy resin, polyamide resin or liquid crystalline polyester.

The vertical conductors (71, 72) are connected at one end to the first semiconductor surface electrode 51 and the second semiconductor surface electrode 52. The vertical conductors (71, 72) include a first vertical conductor 71 and a second vertical conductor 72. The first vertical conductor 71 passes through the insulating layer 6 and is connected to the first semiconductor surface electrode 51, while the second vertical conductor 72 passes through the insulating layer 6 and is connected to the second semiconductor surface electrode 52. Both the first vertical conductor 71 and the second vertical conductor 72 are expansion metallic bodies containing a metallic component that expands upon solidification (hereinafter referred to as "solidification expansion metallic component"), e.g., Bi. Materials constituting the first vertical conductor 71 and the second vertical conductor 72 may include at least one component selected from the group consisting of Ga, Sb, Ag, Cu and Ge and the above-mentioned solidification expansion metallic component. It is also possible that the first vertical conductor 71 is formed to reach the n-type semiconductor layer 31, passing through the lamination of the active layer 4 and the p-type semiconductor layer 32. With this structure, the light emitting area can be increased.

The support substrate 9 has a substrate part 91 and through electrodes (94, 95). The support substrate 9 may be a ceramic substrate. Preferably, it is a substrate mainly comprising Si (semiconductor substrate). In the case where the support substrate 9 is a semiconductor substrate, insulating layers 92, 93 are provided on both sides thereof. In the case of the semiconductor substrate, furthermore, it is preferred that both sides 91-1 in a thickness direction and an inner wall surface 91-2 of a through hole 90 for each through electrode (94, 95) are oxidized or nitrided. The oxidation may be natural oxidation or forced oxidation. Alternatively, the support substrate 9 may be an insulating resin substrate or an insulating ceramic substrate. In this case, the insulating layers 92, 93 can be omitted.

The through electrodes (94, 95) are expansion metallic bodies containing a metallic component that expands upon solidification, e.g., Bi and include a first through electrode 94 and a second through electrode 95. The first through electrode 94 passes through the substrate part 91 and is connected to the first vertical conductor 71, while the second through electrode 95 passes through the substrate part 91 and is connected to the second vertical conductor 72. The first through electrode 94 and the second through electrode 95 are also expansion metallic bodies containing a metallic component that expands upon solidification like the first vertical conductor 71 and the second vertical conductor 72.

As described above, the light-emitting device according to the present invention comprises the light-emitting element 1 and the support substrate 9, and the support substrate 9 is disposed on the insulating layer 6 covering the semiconductor layer of the light-emitting element 1. With this structure, since the ultrathin light-emitting element 1 is reinforced with the support substrate 9, handleability during the production process can be greatly improved to enhance productivity and production efficiency.

Moreover, the light-emitting element 1 and the support substrate 9 can be prepared in separate processes and then integrated such as by a process of bonding the support substrate 9 to the insulating layer 6 of the light-emitting element 1, or otherwise a filling process for the vertical conductor and the through electrode can be performed at one time with the support substrate 9 being bonded to the light-emitting element 1. Therefore, it can be manufactured efficiently according to an optimal manufacturing method suitable for production facilities.

Furthermore, since the support substrate 9 serves as an interposer, a rational feeder circuit for the light-emitting element 1 can be realized by using the support substrate 9.

By using the support substrate 9 as an insulating substrate, still furthermore, the thickness of the insulating layer 6 in the light-emitting element 1 can be reduced to facilitate a drilling process for the insulating layer 6 and a subsequent vertical conductor formation process.

The light-emitting element 1 has the transparent crystal substrate 2 and the semiconductor layer (31, 32), wherein the transparent crystal substrate 2 has the light-emitting surface 21 at one side thereof, while the semiconductor layer (31, 32) is disposed on the other surface 22 of the transparent crystal substrate 2 opposite from the light-emitting surface 21. This structure forms the basis for realizing a structure in which none of electrodes for the semiconductor layer (31, 32), i.e., neither a p-side electrode nor an n-side electrode appears on the light-emitting surface 21. With this structure, since the electrodes never decrease the area of the light-emitting surface 21, there can be realized a light-emitting device having a large light-emission amount and a high light-emission efficiency.

In the present invention, of the p-type and n-type semiconductor layers 32, 31 of the semiconductor layer (31, 32), the n-type semiconductor layer 31 close to the transparent crystal substrate 2 has the portion 33 not overlapping the p-type semiconductor layer 32 as a specific structure for realizing the structure in which none of electrodes for the semiconductor layer (31, 32) appears on the light-emitting surface 21.

The first semiconductor surface electrode 51 is disposed on the surface of the non-overlapping portion 33 of the n-type semiconductor layer 31, while the second semiconductor surface electrode 52 is disposed on the surface of the p-type semiconductor layer 32 directed to the same direction as the surface having the first semiconductor surface electrode 51. Accordingly, a current is supplied to the semiconductor layer (31, 32) from a side opposite from the side having the transparent crystal substrate 2. The semiconductor layer (31, 32) is covered with the insulating layer 6 and therefore protected by the insulating layer 6.

The first vertical conductor 71 passes through the insulating layer 6 and is connected to the first semiconductor surface electrode 51, while the second vertical conductor 72 passes through the insulating layer 6 and is connected to the second semiconductor surface electrode 52. On the other hand, the support substrate 9 disposed on the insulating layer 6 of the light-emitting element 1 has the first through electrode 94 and the second through electrode 95, wherein the first through electrode 94 passes through the substrate part 91 and is connected to the first vertical conductor 71, while the second through electrode 95 passes through the substrate part 91 and is connected to the second vertical conductor 72.

To the first and second semiconductor surface electrodes 51, 52 for the semiconductor layer, accordingly a current is supplied from a side opposite from the side having the transparent crystal substrate 2 through a circuit of the first through electrode 94 and the first vertical conductor 71 and a circuit of the second through electrode 95 and the second vertical conductor 72.

The first and second vertical conductors 71, 72 are expansion metallic bodies. The expansion metallic body is formed by a molten metal filling process such that a molten metal is poured into a vertical hole 70 formed in the insulating layer 6 and then solidified. Accordingly, there can be obtained high-quality first and second vertical conductors 71, 72 having a compact structure free from any cavity, void or hollow.

The expansion metallic body forming the first and second vertical conductors 71 72 contains a metallic component that expands in volume upon solidification, i.e., a solidification expansion metallic component. Its specific examples include Bi (bismuth) and In (indium). By adding a solidification expansion metallic component such as Bi, compact vertical conductors (71, 72) free from any void or hollow can be formed within the vertical hole 70 because of the volume expansion property upon solidification.

The expansion metallic body forming the first and second through electrodes 94, 95 also contains a solidification expansion metallic component. A specific example of the solidification expansion metallic component and its effect are the same as described above. Because of the volume expansion property of the solidification expansion metallic component, compact through electrodes free from any void or hollow can be formed within a through hole.

The light-emitting device according to the present invention may have a single or a plurality of light-emitting elements 1. In the case of having a plurality of light-emitting elements 1, there can be realized a surface light-emitting device having a light-emission amount based on the number of light-emitting elements.

In the case of having a plurality of light-emitting elements 1, the light-emitting elements 1 are preferably separated from each other by a separation groove 8 extending in the transparent crystal substrate 2, the semiconductor layer and the insulating layer 6. This is because the individual light-emitting elements 1 can emit light in an electrically stable state.

In this embodiment, the support substrate 9 is shared by the light-emitting elements 1; this is because the structure can be simplified to facilitate its production.

The light-emitting surface 21 of the transparent crystal substrate 2 may have small irregularities. This enables the light-emitting surface 21 of the transparent crystal substrate 2 to diffuse or disperse light, achieving uniform surface light emission. Alternatively, a transparent optical component having small irregularities may be disposed on the light-emitting surface 21 of the transparent crystal substrate 2. Also in this case, the same effects can be obtained. Furthermore, a fluorescent body may be disposed on the light-emitting surface 21 of or inside the transparent crystal substrate 2.

2. Method for Manufacturing the Light-Emitting Device

Figure 2:
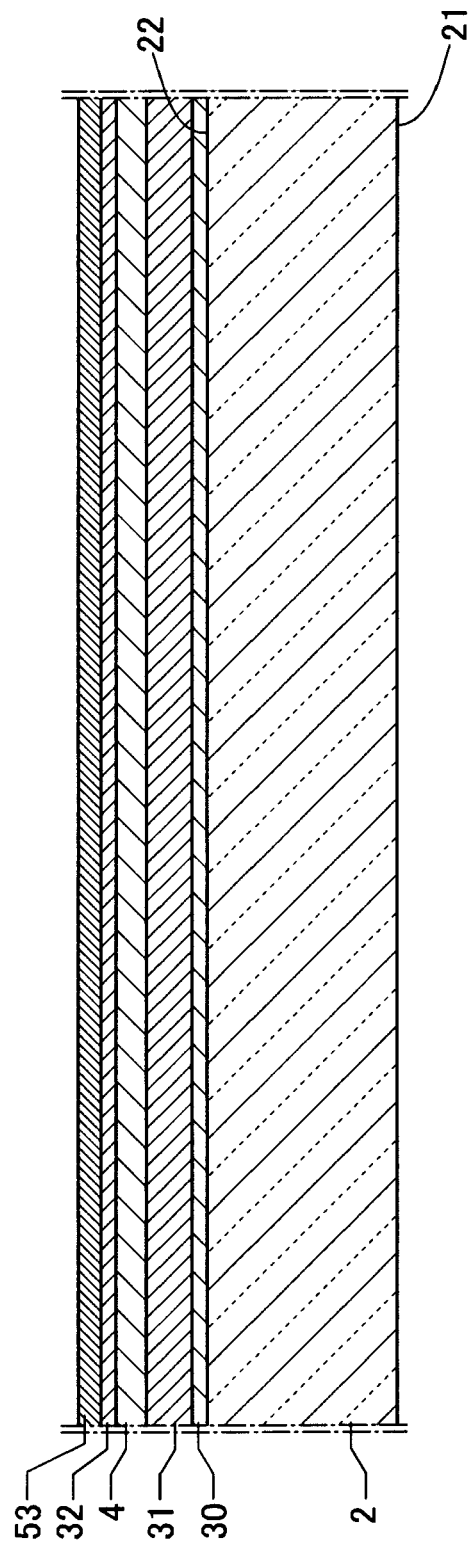
FIG. 2 is a partial sectional view showing a method for manufacturing a light-emitting device according to one embodiment of the present invention.

Next will be described a method for manufacturing the light-emitting device shown in FIG. 1 with reference to FIGS. 2 to 21. First of all, FIG. 2 shows a structure in which the n-type semiconductor layer 31, the active layer 4 and the p-type semiconductor layer 32 are stacked in the named order on the buffer layer 30 formed on the other surface 22 of the sapphire transparent crystal substrate 2 opposite from the light-emitting surface 21, and the light reflective electrode film 53 is formed on the p-type semiconductor layer 32. The transparent crystal substrate 2 has a thickness of 0.5 mm, the n-type semiconductor layer 31 has a thickness of 6 µm, and the p-type semiconductor layer 32 has a thickness of 0.2 µm although they are mere examples and should not be construed as limitative.

Figure 3:
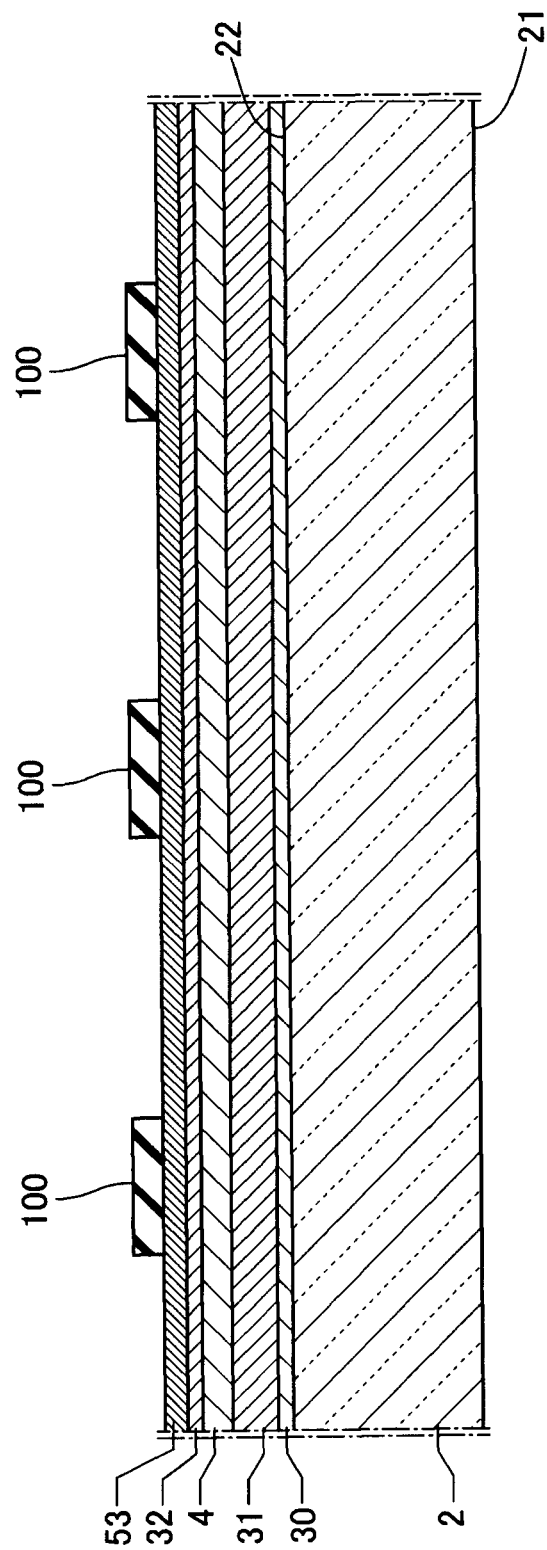
FIG. 3 is a partial sectional view showing a process after the process shown in FIG. 2.
Figure 4:
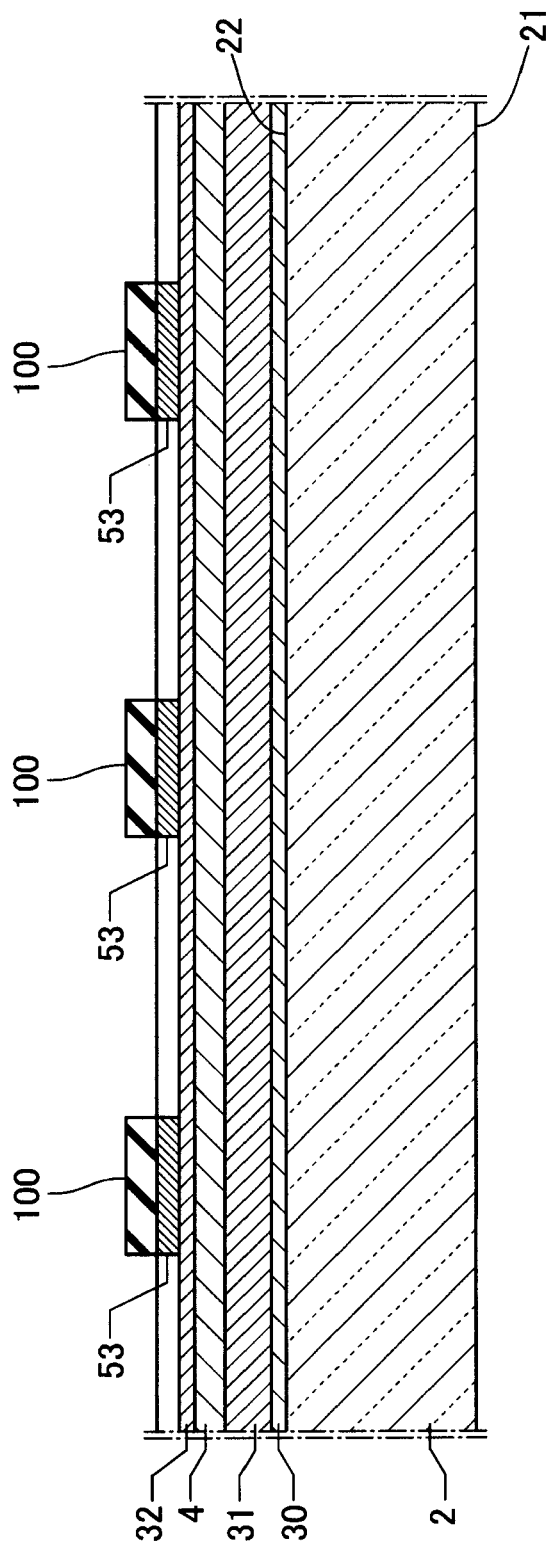
FIG. 4 is a partial sectional view showing a process after the process shown in FIG. 3.

Then, as shown in FIG. 3, a photolithography process is performed on the light reflective electrode film 53, whereby a photoresist film 100 is patterned into a given pattern, and then, as shown in FIG. 4, the light reflective electrode film 53 is etched by using the photoresist film 100 as a mask. The light reflective electrode film 53 is etched by chemical wet etching.

Figure 5:
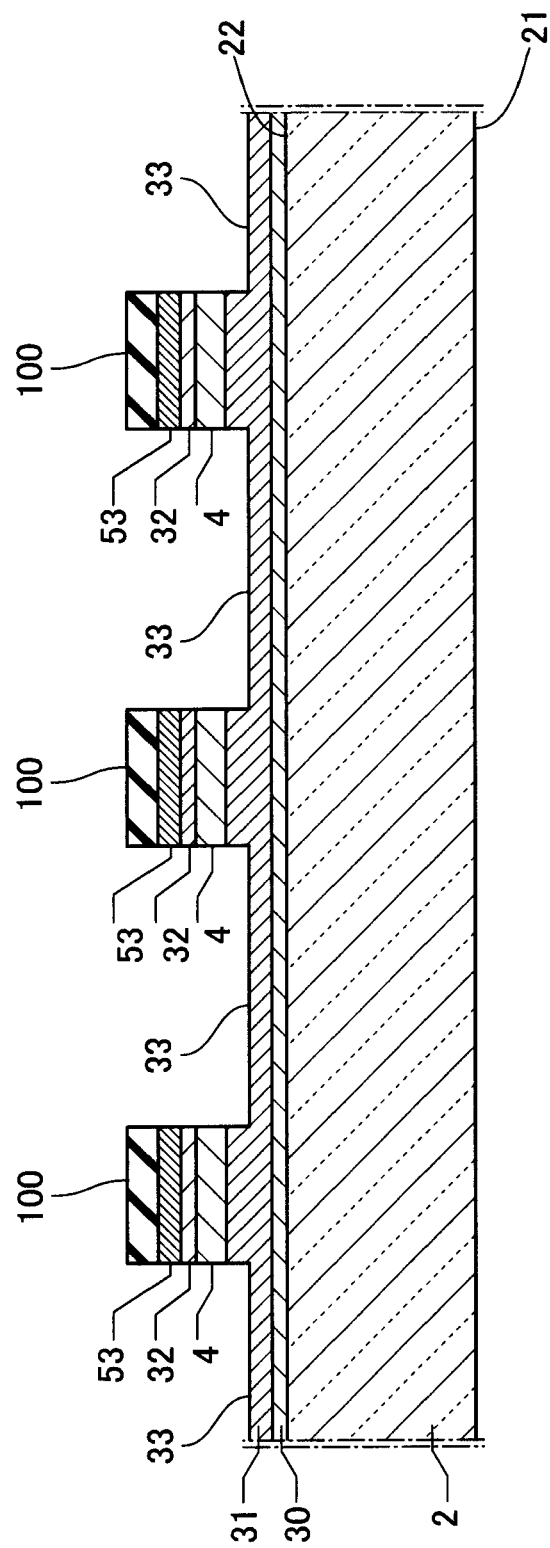
FIG. 5 is a partial sectional view showing a process after the process shown in FIG. 4.

Then, as shown in FIG. 5, the p-type semiconductor layer 32, the active layer 4 and the n-type semiconductor layer 31 are etched by using the photoresist film 100 and the underlying light reflective electrode film 53 as a mask. For this etching, dry etching such as RIE (reactive-ion etching) can be employed. The n-type semiconductor layer 31 is not completely etched but partially etched to leave the portion 33 not overlapping the p-type semiconductor layer 32. Thus, the light reflective electrode film 53, the p-type semiconductor layer 32, the active layer 4 and the n-type semiconductor layer 31 are patterned to provide individual light-emitting elements. In the figure, the surface of the non-overlapping portion 33 is set back from the surface in contact with the active layer 4 in a stepped manner, but it may extend continuously and planarly from the surface in contact with the active layer 4. The surface position of the non-overlapping portion 33 can be controlled by an etching amount.

Figure 6:
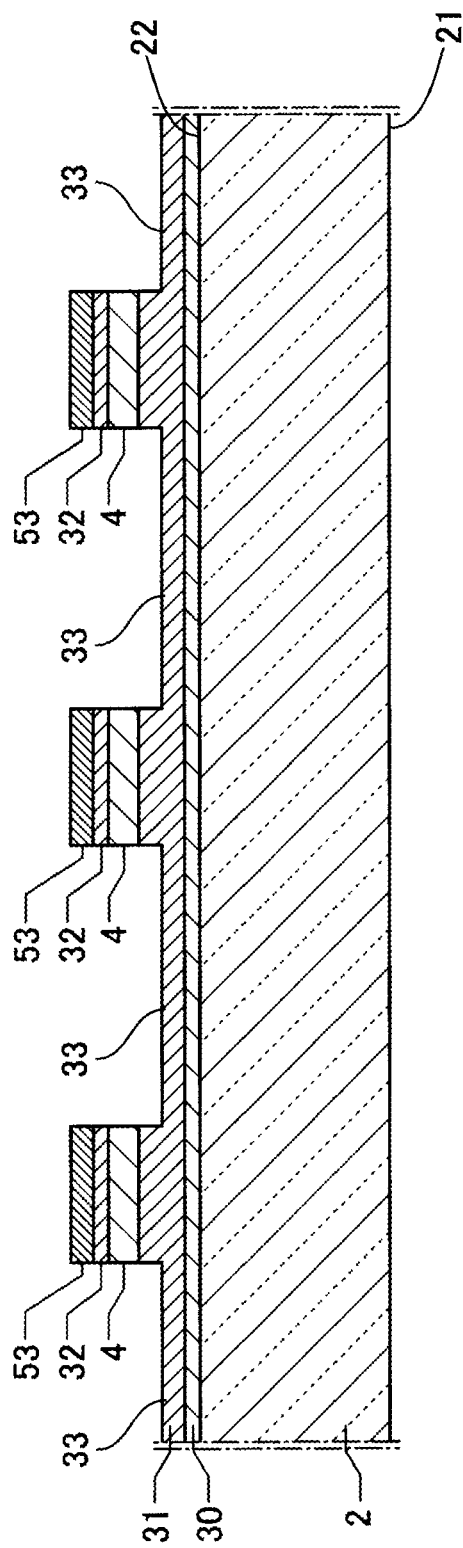
FIG. 6 is a partial sectional view showing a process after the process shown in FIG. 5.

Then, the photoresist film 100 used as a mask is removed such as by ashing, as shown in FIG. 6.

Figure 7:
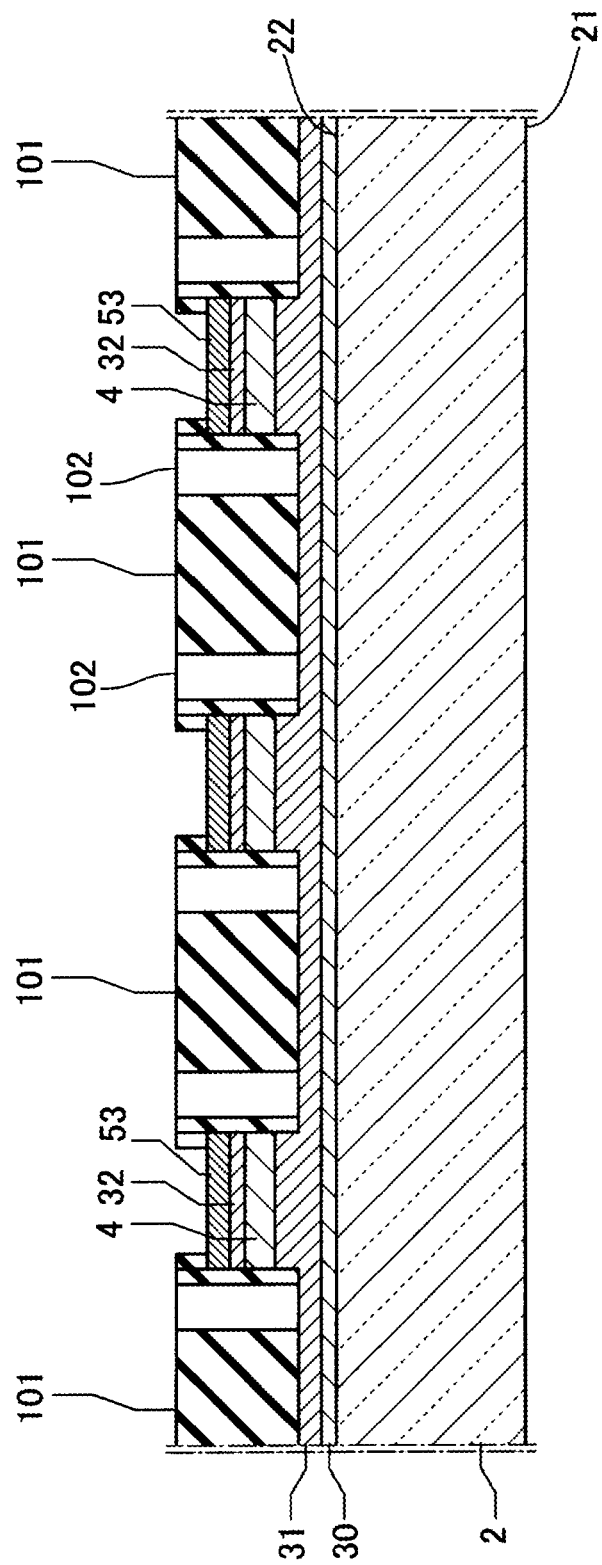
FIG. 7 is a partial sectional view showing a process after the process shown in FIG. 6.

Then, a photoresist film is applied to cover all the light-emitting elements, and then the photoresist film 101 is patterned by performing a photolithography process, as shown in FIG. 7, thereby forming photoresist holes 102 for formation of the first semiconductor surface electrode 51 and the second semiconductor surface electrode 52. The photoresist holes 102 are formed such that the non-overlapping portion 33 of the n-type semiconductor layer 31 or the light reflective electrode film 53 on the p-type semiconductor layer 32 appears at the bottom. The photoresist film 101 has a thickness of about 5 µm, for example.

Figure 8:
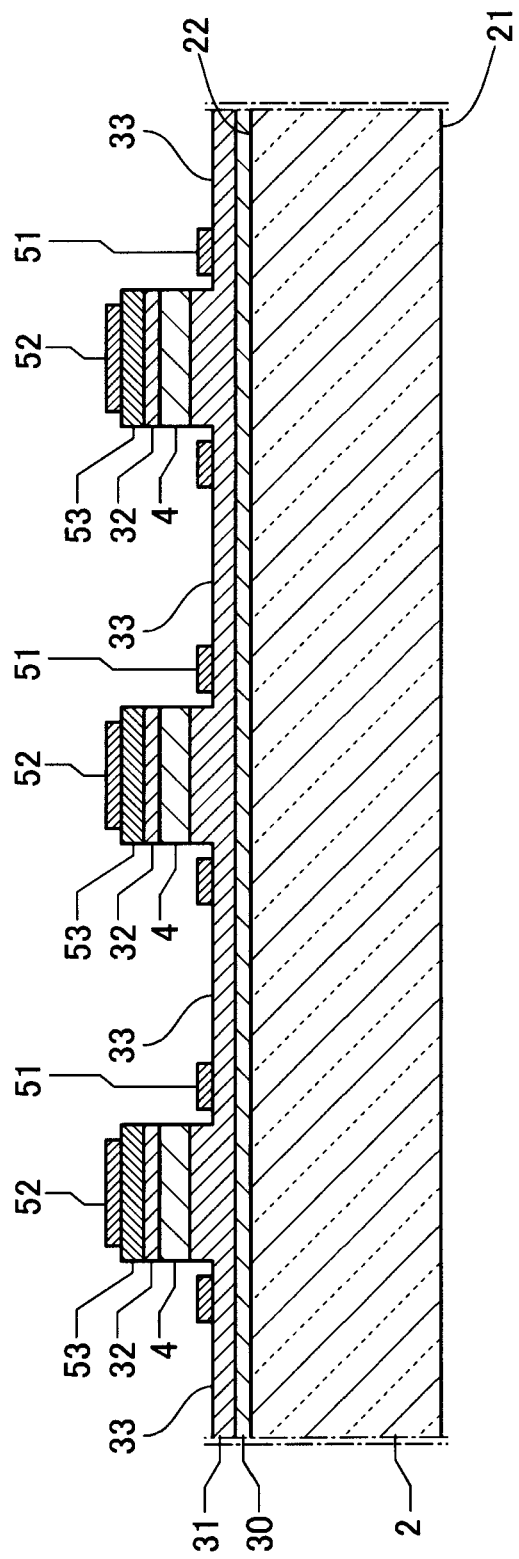
FIG. 8 is a partial sectional view showing a process after the process shown in FIG. 7.

Then, by using a thin-film deposition process such as sputtering, as shown in FIG. 8, the first semiconductor surface electrode 51 and the second semiconductor surface electrode 52 are formed on the non-overlapping portion 33 of the n-type semiconductor layer 31 and the light reflective electrode film 53 on the p-type semiconductor layer 32 appearing at the bottom of the photoresist holes 102. The first semiconductor surface electrode 51 and the second semiconductor surface electrode 52 have a thickness of about 1 µm, for example.

Figure 9:
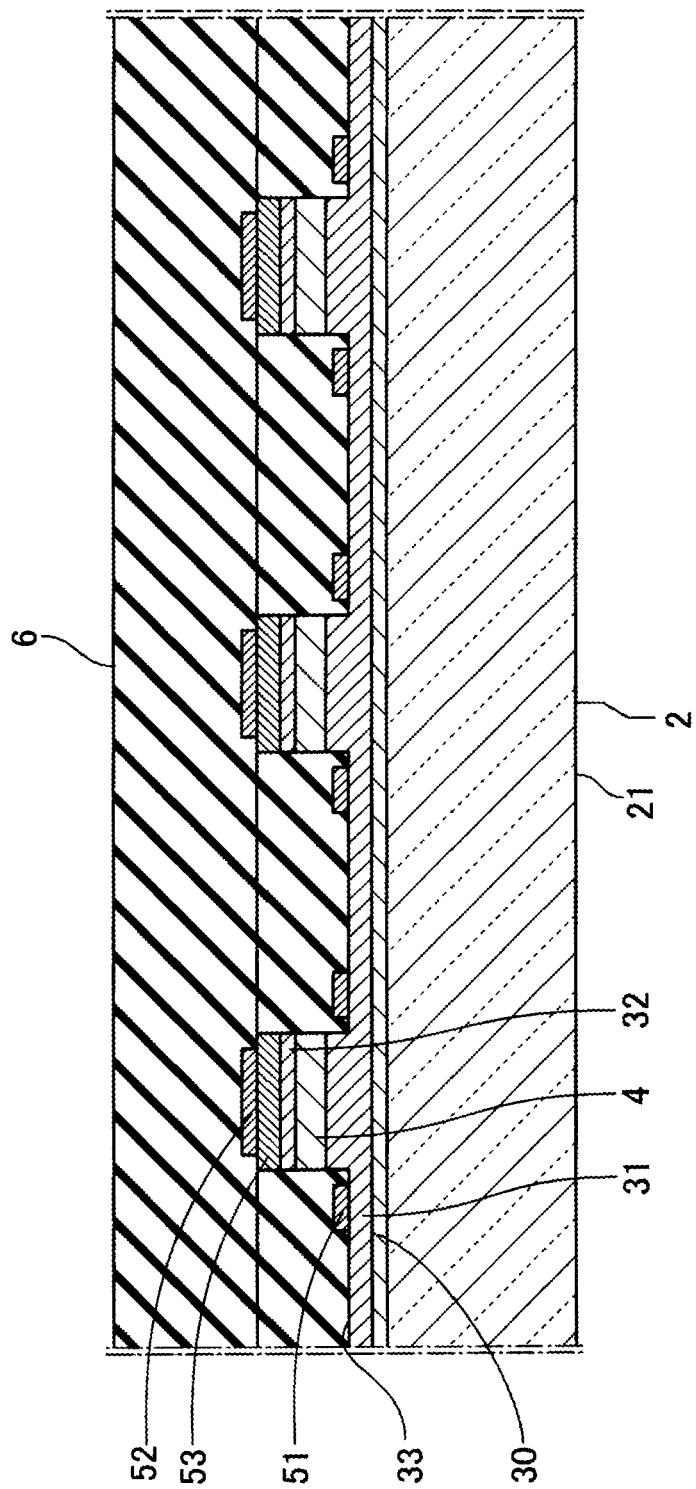
FIG. 9 is a partial sectional view showing a process after the process shown in FIG. 8.
Figure 10:
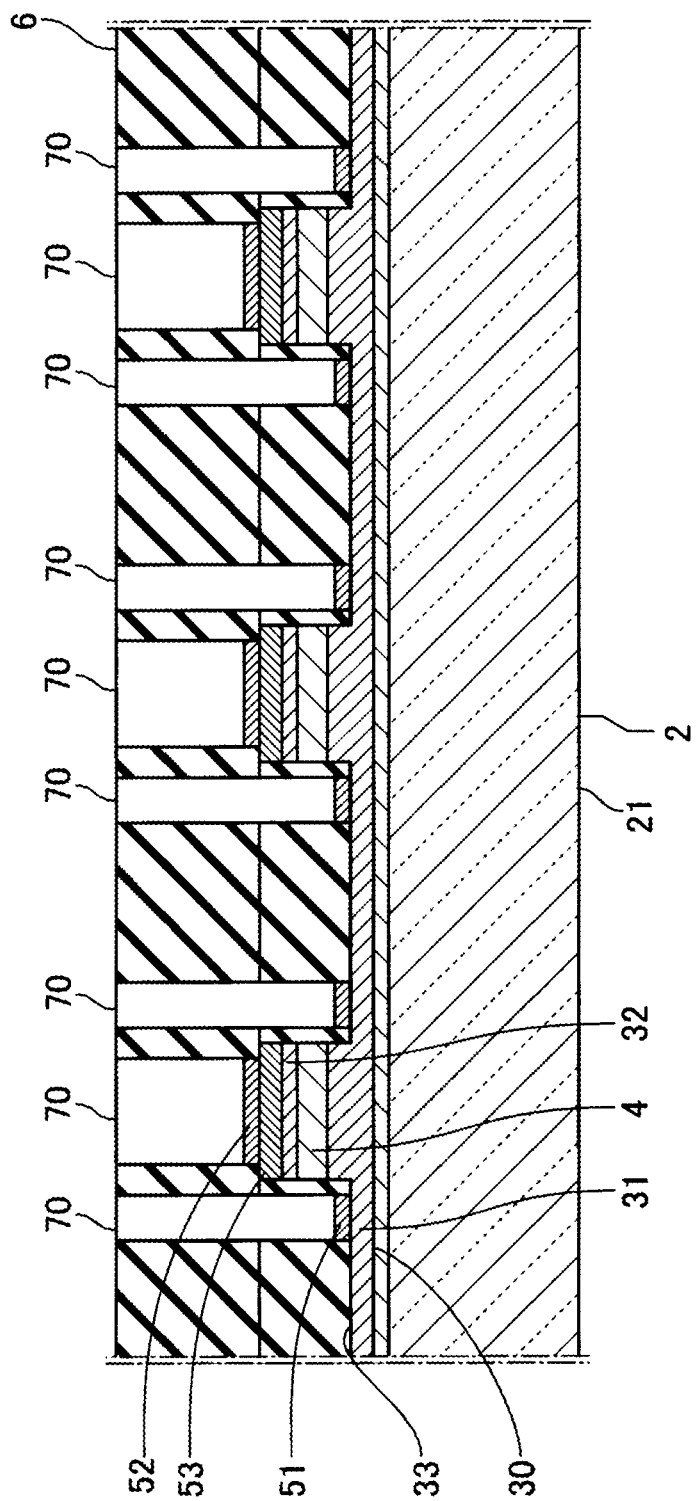
FIG. 10 is a partial sectional view showing a process after the process shown in FIG. 9.

Then, as shown in FIG. 9, the insulating layer 6 is formed by applying a photoresist layer covering all the light-emitting elements, and then a photolithography process is performed on the insulating layer 6 for exposure and development, thereby drilling the vertical holes 70 leading to the first semiconductor surface electrode 51 and the second semiconductor surface electrode 52, as shown in FIG. 10.

Figure 11:
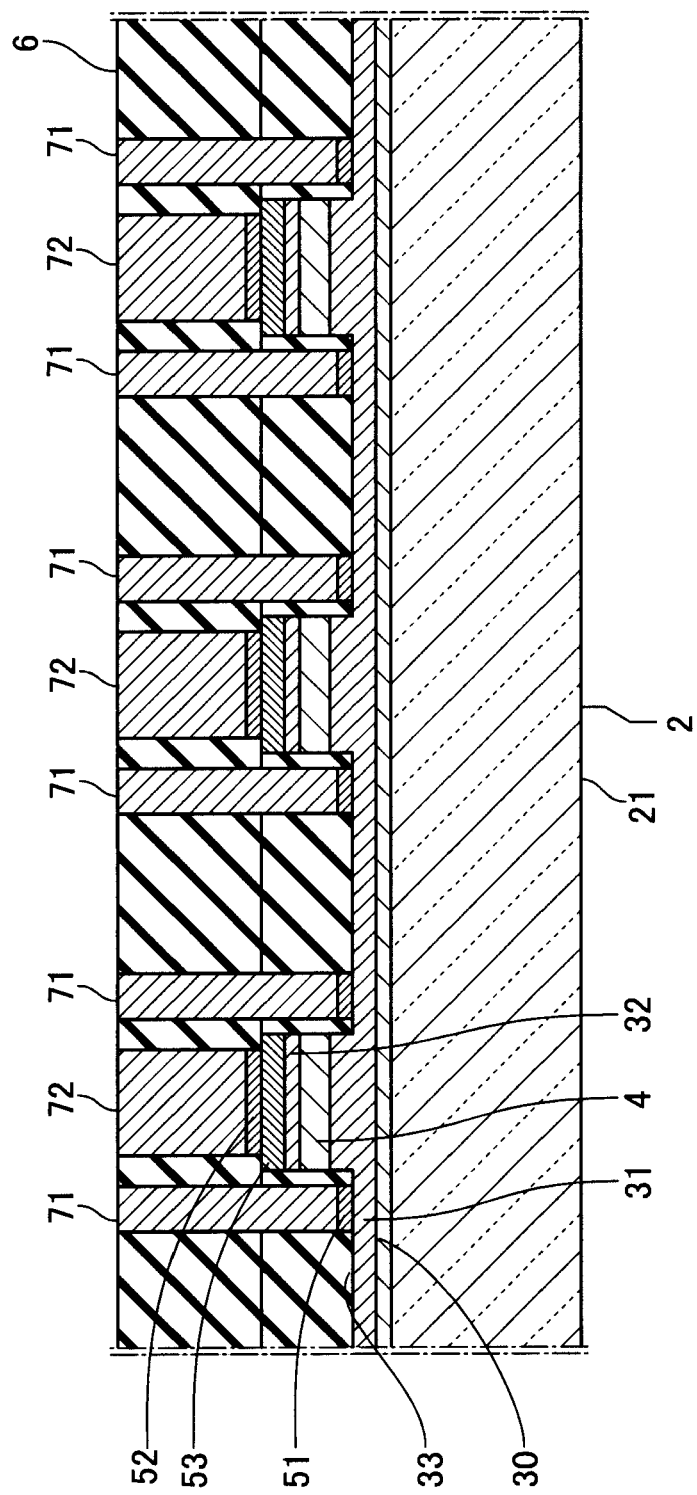
FIG. 11 is a partial sectional view showing a process after the process shown in FIG. 10.

Then, as shown in FIG. 11, a molten metal containing a metallic component that expands upon solidification, e.g., Bi (bismuth) is filled into the vertical holes 70 thus drilled and then solidified to form the first vertical conductor 71 and the second vertical conductor 72. Upon formation of the first vertical conductor 71 and the second vertical conductor 72, the molten metal is poured into the vertical holes 70 formed in the insulating layer 6 and the molten metal poured into the vertical holes 70 is cooled and solidified while being subjected to a mechanical force such as a pressing pressure using a pressing plate, an injection pressure or a rolling pressure. Thus, expansion metallic bodies having a compact structure free from any cavity, void or hollow can be formed efficiently in a short time.

Typical examples of metallic materials to be used for forming the first vertical conductor 71 and the second vertical conductor 72 according to a molten metal filling process include Bi, In, Sn and Cu. Particularly when containing Bi, the first and second vertical conductors 71, 72 can be formed compactly within the vertical holes 70 without causing any hollow or void because of the volume expansion property of Bi upon solidification. The above-mentioned metallic materials can be used as the molten metal such that a powder of particles (nanoparticles) being an aggregate of polycrystals having a grain size of 1 μm or less and a crystal size of 200 nm or less is melted for use.

The vertical holes 70 can readily be formed by using a known drilling technique such as a laser drilling process or a chemical drilling process. Moreover, since the first vertical conductor 71 and the second vertical conductor 72 are expansion metallic bodies filled into the vertical holes 70 thus drilled and then solidified, the electrodes can be formed by using a pressure-filling process such that the molten metal is filled into the vertical holes 70 and solidified while being subjected to a pressure. With this process, the first vertical conductor 71 and the second vertical conductor 72 can be formed compactly within the vertical holes 70 without having any hollow. When using the molten metal filling process, more specifically, the insulating layer 6 heated by the molten metal shrinks with a decrease in temperature of the molten metal. At this time, if the molten metal is a normal metallic material that shrinks in volume with a decrease in temperature, a void or hollow will be created between the inner wall surface of the vertical hole 70 and the expansion metallic body. In the present invention, such a void or hollow will never be created because the molten metal contains a solidification expansion metallic component such as Bi. This makes it possible to form high-quality vertical conductors (71, 72) with excellent electrical properties.

Figure 12:
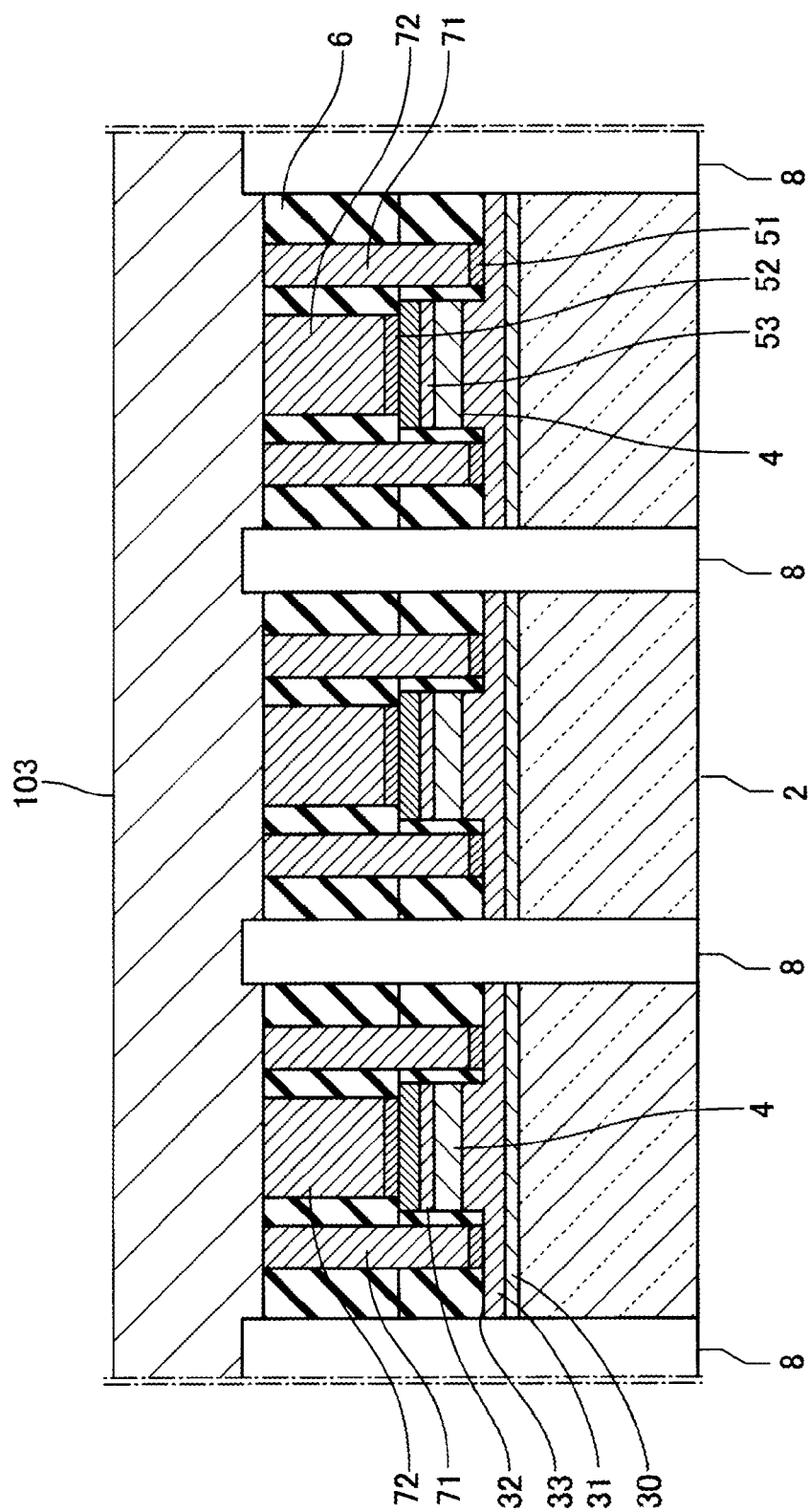
FIG. 12 is a partial sectional view showing a process after the process shown in FIG. 11.

Furthermore, since the above pressure-filling process belongs to a press process, its equipment cost can be remarkably reduced and its processing time can also be reduced as compared with a dry etching process using a conventional ICP-RIE device. Accordingly a low-cost light-emitting device can be realized Then, as shown in FIG. 12, after a dicing tape 103 is adhered to the surface of the insulating layer 6, the transparent crystal substrate 2, the buffer layer 30, the non-overlapping portion 33 of the n-type semiconductor layer 31 and the insulating layer 6 are subjected to dicing to form the separation grooves 8. Then, the dicing tape 103 is peeled off and the surface of the insulating layer 6 is set back from the ends of the first and second vertical conductors 71, 72 by selectively using a chemical etching process, a physical etching process or a combination thereof, if necessary, thereby projecting the ends of the first and second vertical conductors 71, 72.

Figure 13:
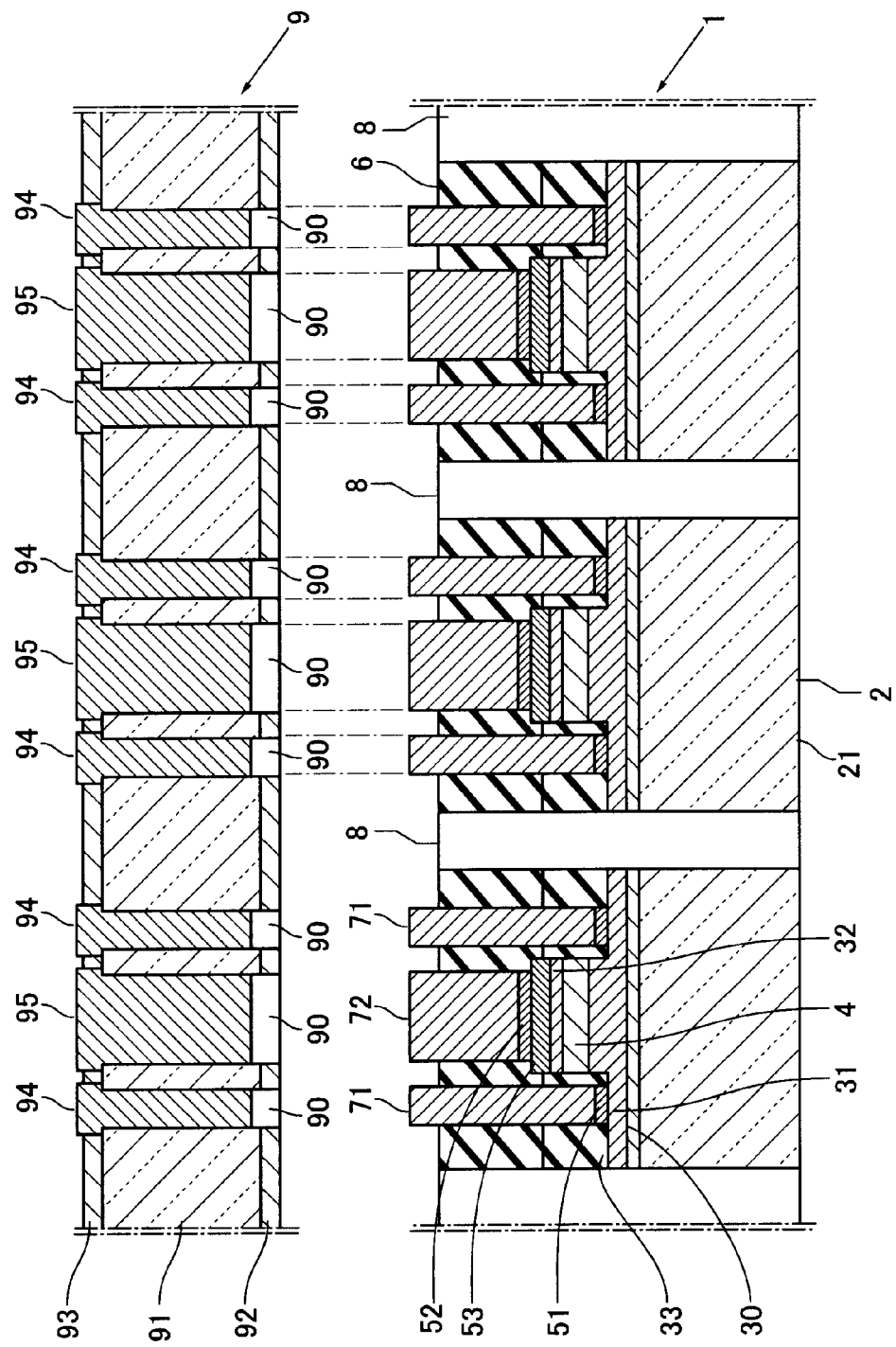
FIG. 13 is a partial sectional view showing a process after the process shown in FIG. 12.
Figure 14:
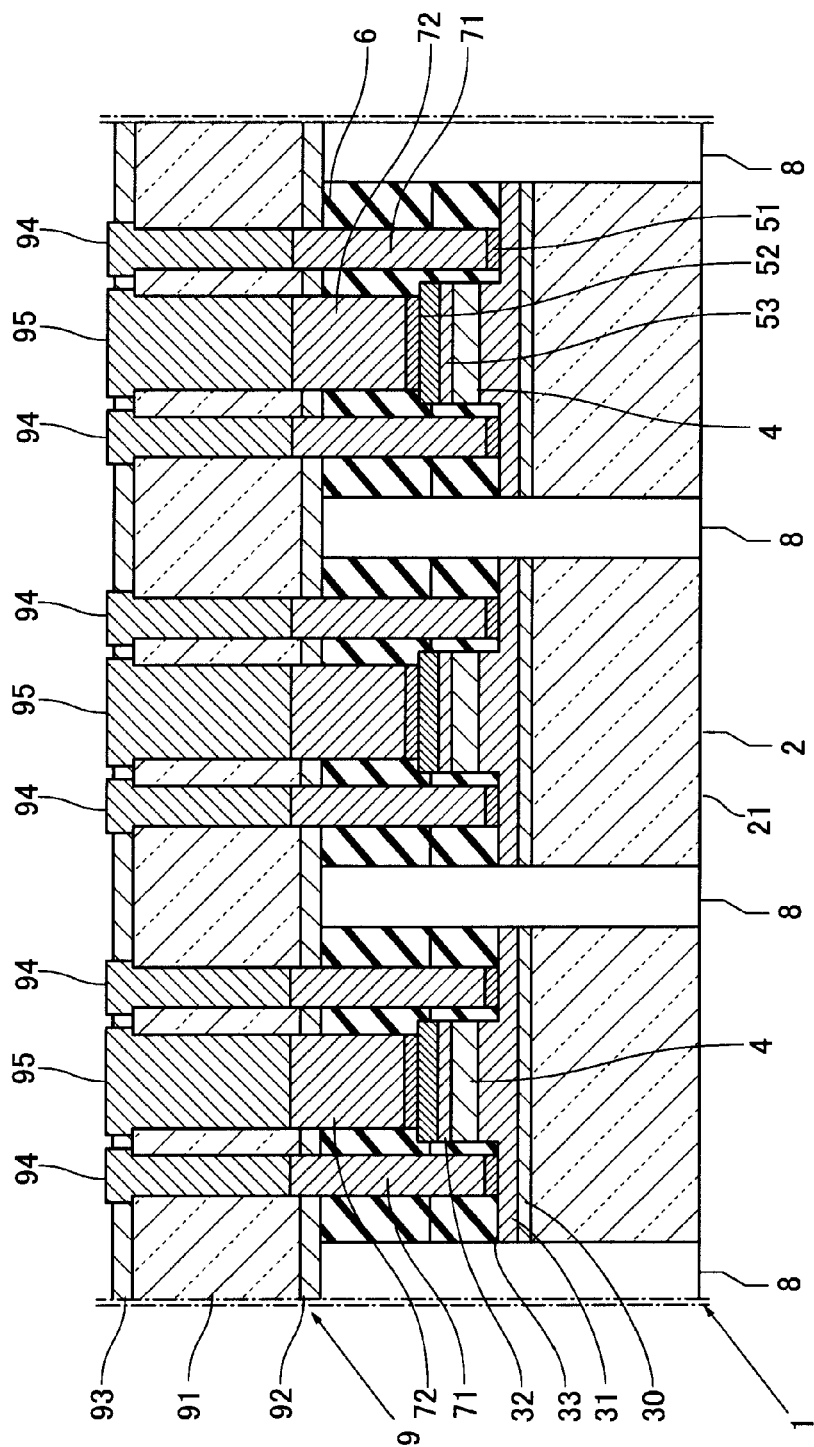
FIG. 14 is a partial sectional view showing a process after the process shown in FIG. 13.

Then, as shown in FIGS. 13 and 14, the support substrate 9 is bonded to the insulating layer 6, and the first and second vertical conductors 71, 72 are joined to the first and second through electrodes 94, 95.

In the case where the surface of the insulating layer 6 is set back from the ends of the first and second vertical conductors 71, 72, thereby projecting the ends of the first and second vertical conductors 71, 72, the tips of the first and second through electrodes 94, 95 are set back to a depth corresponding to the projecting amount of the ends of the first and second vertical conductors 71, 72, wherein the ends of the first and second vertical conductors 71, 72 are fitted into the through holes 90 in a so-called "inro" manner. Thus, alignment can be performed simultaneously with bonding. Instead of the illustrated one, it is also possible that the surface of the support substrate 9 is set back from the ends of the first and second through electrodes 94, 95, thereby projecting the ends of the first and second through electrodes 94, 95, while the tips of the first and second vertical conductors 71, 72 are set back to a depth corresponding to the projecting amount of the ends of the first and second through electrodes 94, 95.

Regarding when to form the vertical holes 70 in the insulating layer 6, when to form the first and second vertical conductors 71, 72 in the insulating layer 6, when to bond the support substrate 9 and when to form the first and second through electrodes 94, 95 in the support substrate 9, there are several options. Some of them will be described below.

(a) After the first and second vertical conductors 71, 72 are formed within the vertical holes 70 of the insulating layer 6, the support substrate 9 in which the first and second through electrodes 94, 95 have been already formed is bonded to the insulating layer 6. FIGS. 13 and 14 illustrate such a process.

Figure 15:
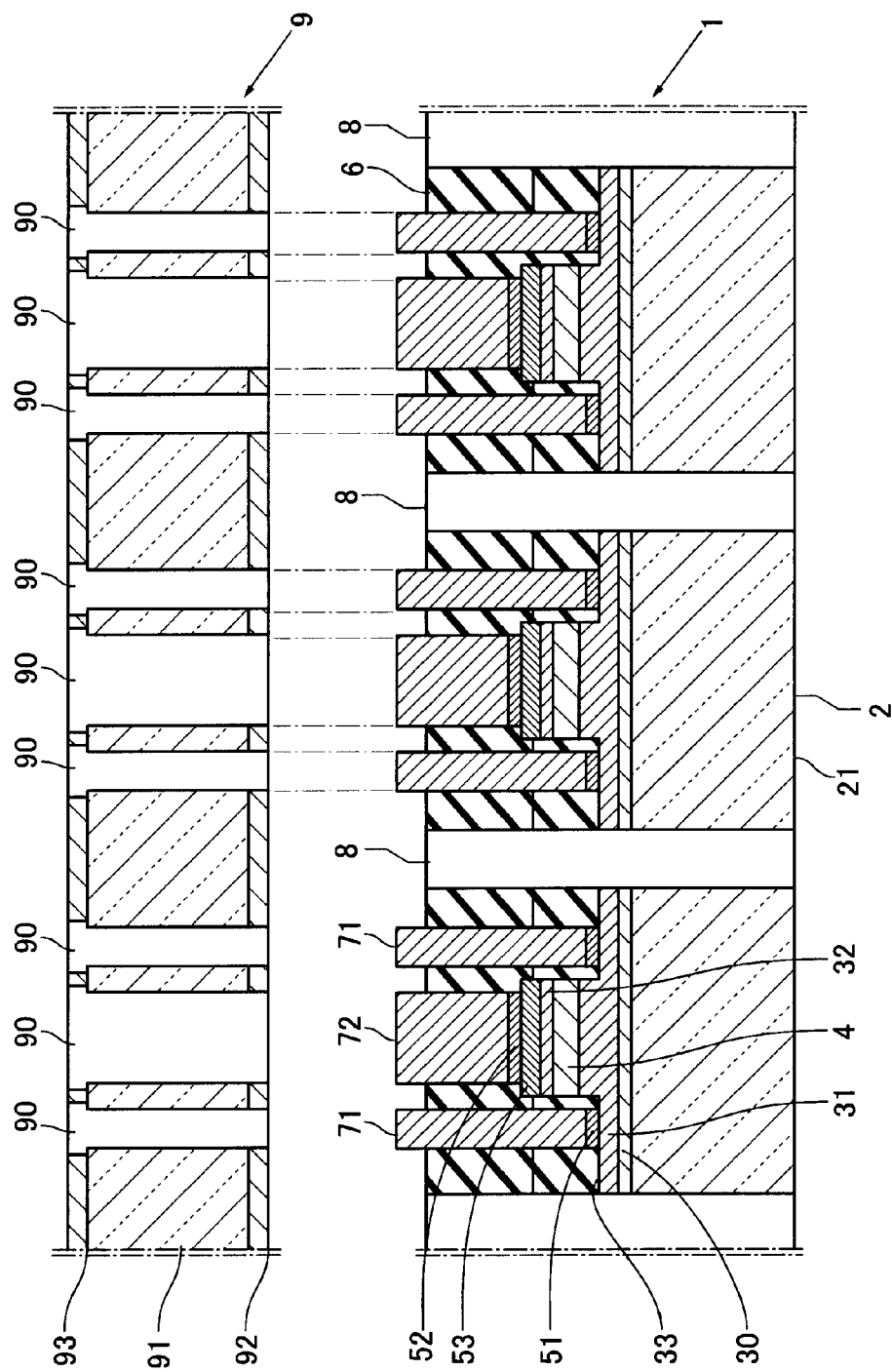
FIG. 15 is a partial sectional view showing another method for manufacturing a light-emitting device according to one embodiment of the present invention.
Figure 16:
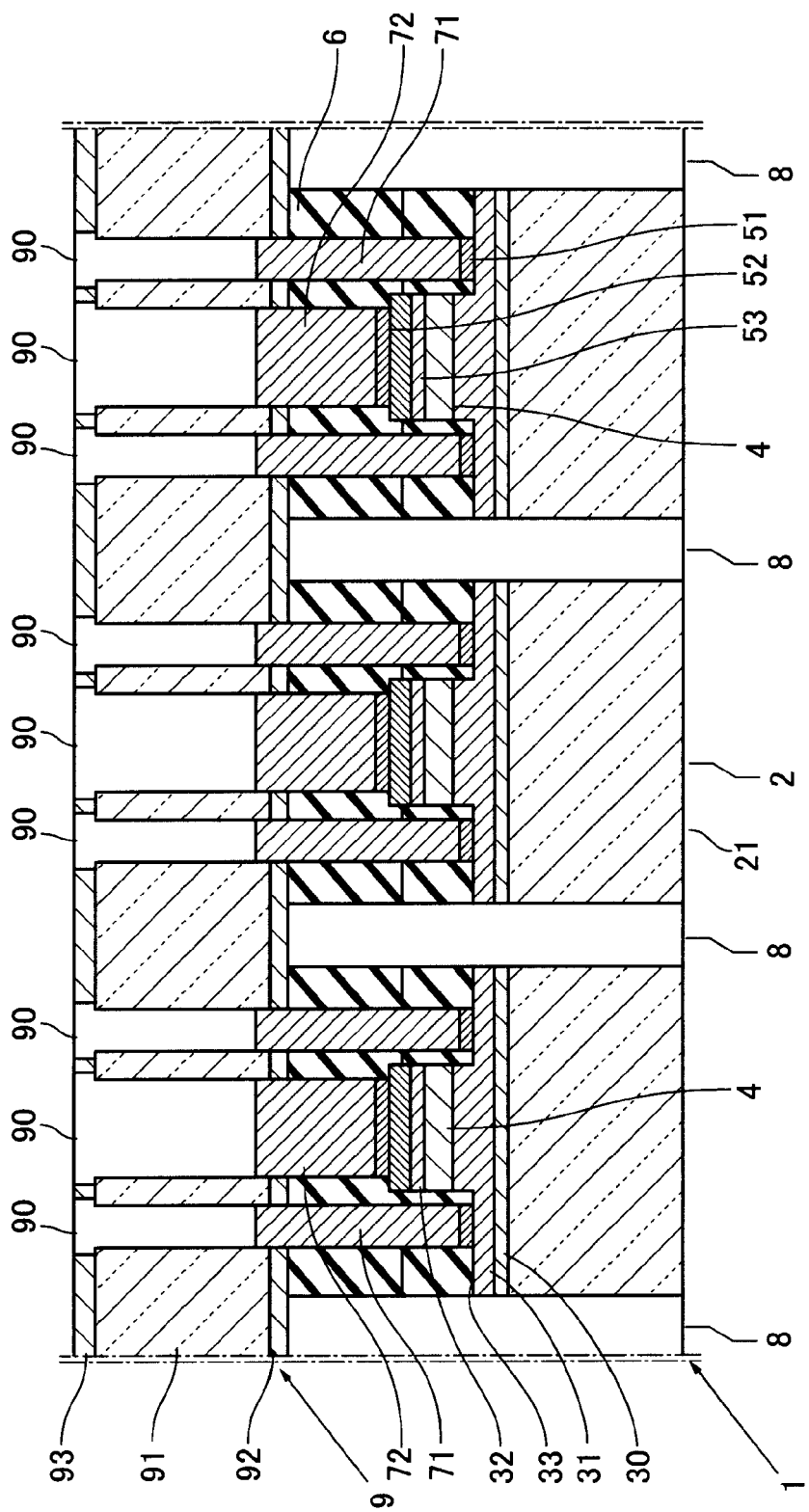
FIG. 16 is a partial sectional view showing a process after the process shown in FIG. 15.
Figure 17:
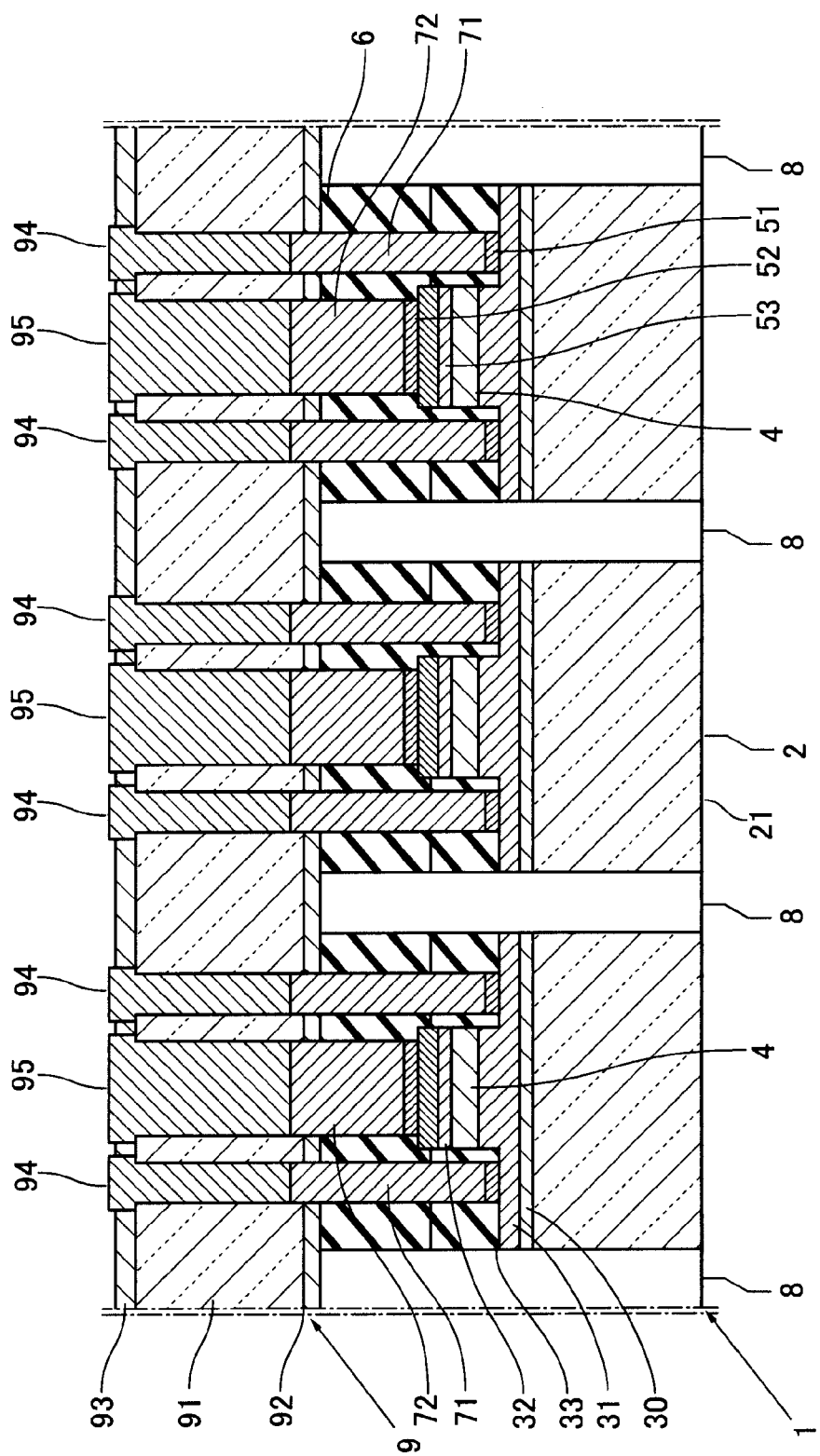
FIG. 17 is a partial sectional view showing a process after the process shown in FIG. 16.

(b) After the first and second vertical conductors 71, 72 are formed as shown in FIG. 15, the support substrate 9 in which the through holes 90 have been already formed but the first and second through electrodes 94, 95 are not formed yet is bonded to the insulating layer 6, as shown in FIG. 16, and then the first and second through electrodes 94, 95 are formed by filling a molten metal into the through holes 90, as shown in FIG. 17.

Figure 18:
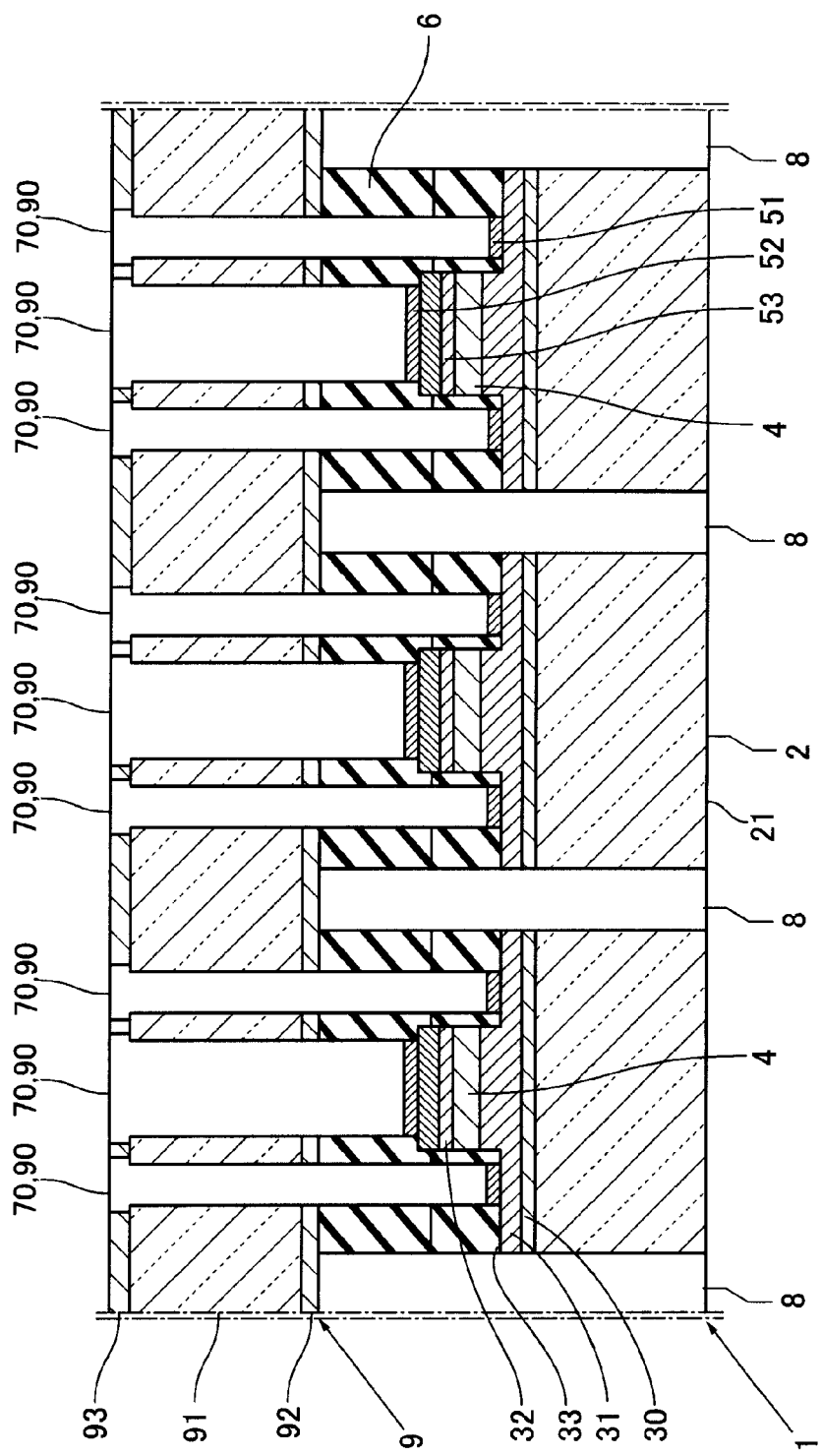
FIG. 18 is a partial sectional view showing still another method for manufacturing a light-emitting device according to one embodiment of the present invention.
Figure 19:
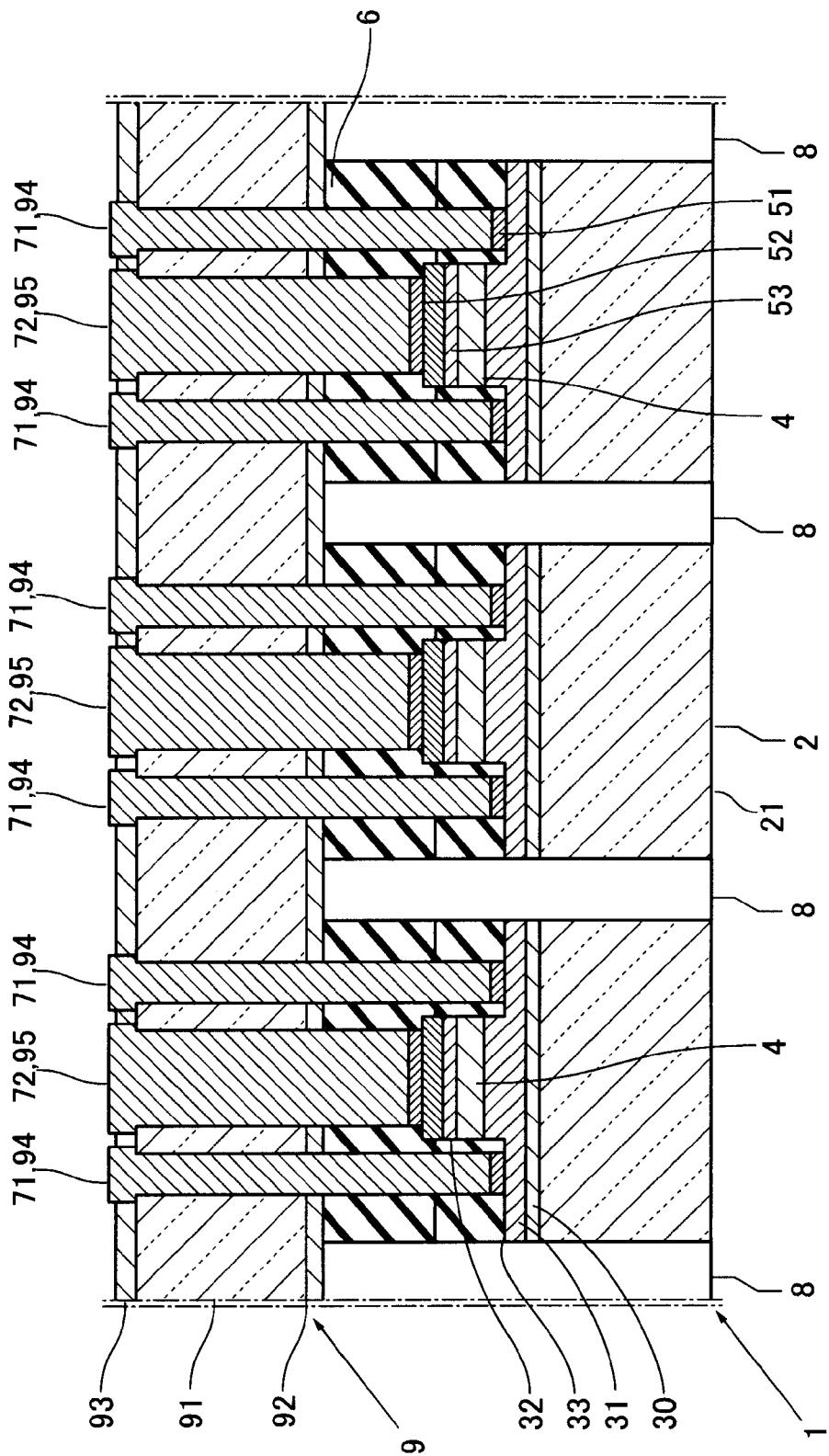
FIG. 19 is a partial sectional view showing a process after the process shown in FIG. 18.

(c) After the vertical holes 70 are formed in the insulating layer 6, the support substrate 9 in which the through holes 90 have been already formed but the first and second through electrodes 94, 95 are not formed yet is bonded to the insulating layer 6 before the formation of the first and second vertical conductors 71, 72, as shown in FIG. 18, and then the first and second vertical conductors 71, 72 and the first and second through electrodes 94, 95 are simultaneously formed by filling a molten metal into the vertical holes 70 and the through holes 90, as shown in FIG. 19.

(d) Before the vertical holes 70 are formed in the insulating layer 6, the support substrate 9 in which the through holes 90 are not formed yet is bonded to the insulating layer 6, and then the vertical holes 70 and the through holes 90 are simultaneously formed and the first and second vertical conductors 71, 72 and the first and second through electrodes 94, 95 are simultaneously formed by filling a molten metal into the vertical holes 70 and the through holes 90.

When bonding the first and second vertical conductors 71, 72 to the first and second through electrodes 94, 95, a junction film can be provided at a junction interface between them. The junction film can comprise at least one low-melting point metallic component selected from the group consisting of Sn, In, Bi, Ga and Sb and a high-melting point metallic material including at least one component selected from the group consisting of Cr, Ag, Cu, Au, Pt, Pd, Ni, an Ni—P alloy and an Ni—B alloy. Since the low-melting point metal can be consumed by reacting with the first and second vertical conductors 71, 72 and the first and second through electrodes 94, 95 and forming an intermetallic compound, the melting point increases considerably after the bonding.

3. Other Forms of the Light-Emitting Device

The light-emitting device according to the present invention can take various forms. Their examples are shown in FIGS. 20 and 21.

Figure 20:
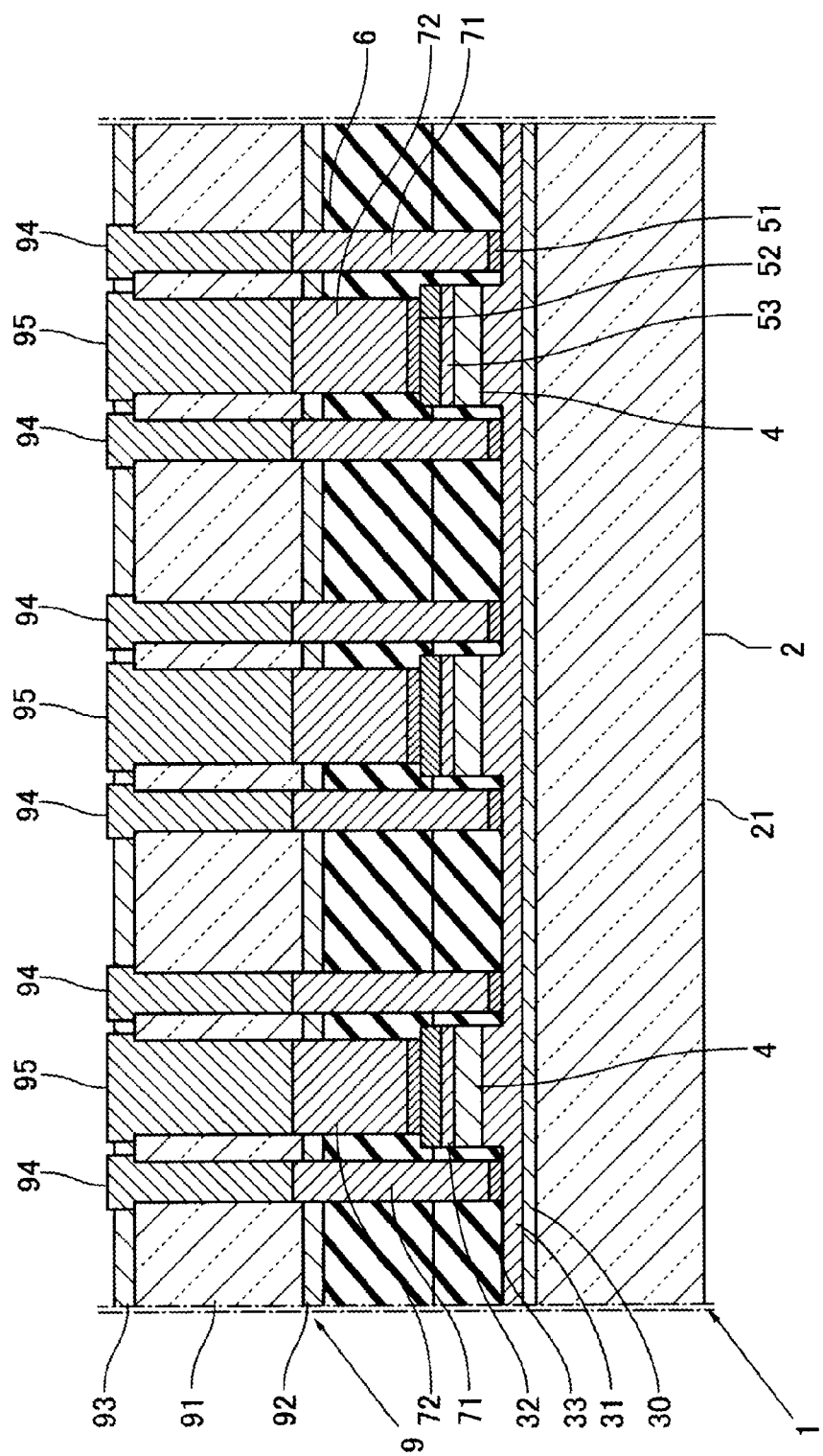
FIG. 20 is a partial sectional view of a light-emitting device according to another embodiment of the present invention.

The light-emitting device shown in FIG. 20 does not have the separation grooves 8 provided in the light-emitting device shown in FIGS. 1 to 19. The transparent crystal substrate 2, the buffer layer 30 and the n-type semiconductor layer 31 are shared by the light-emitting elements 1.

Figure 21:
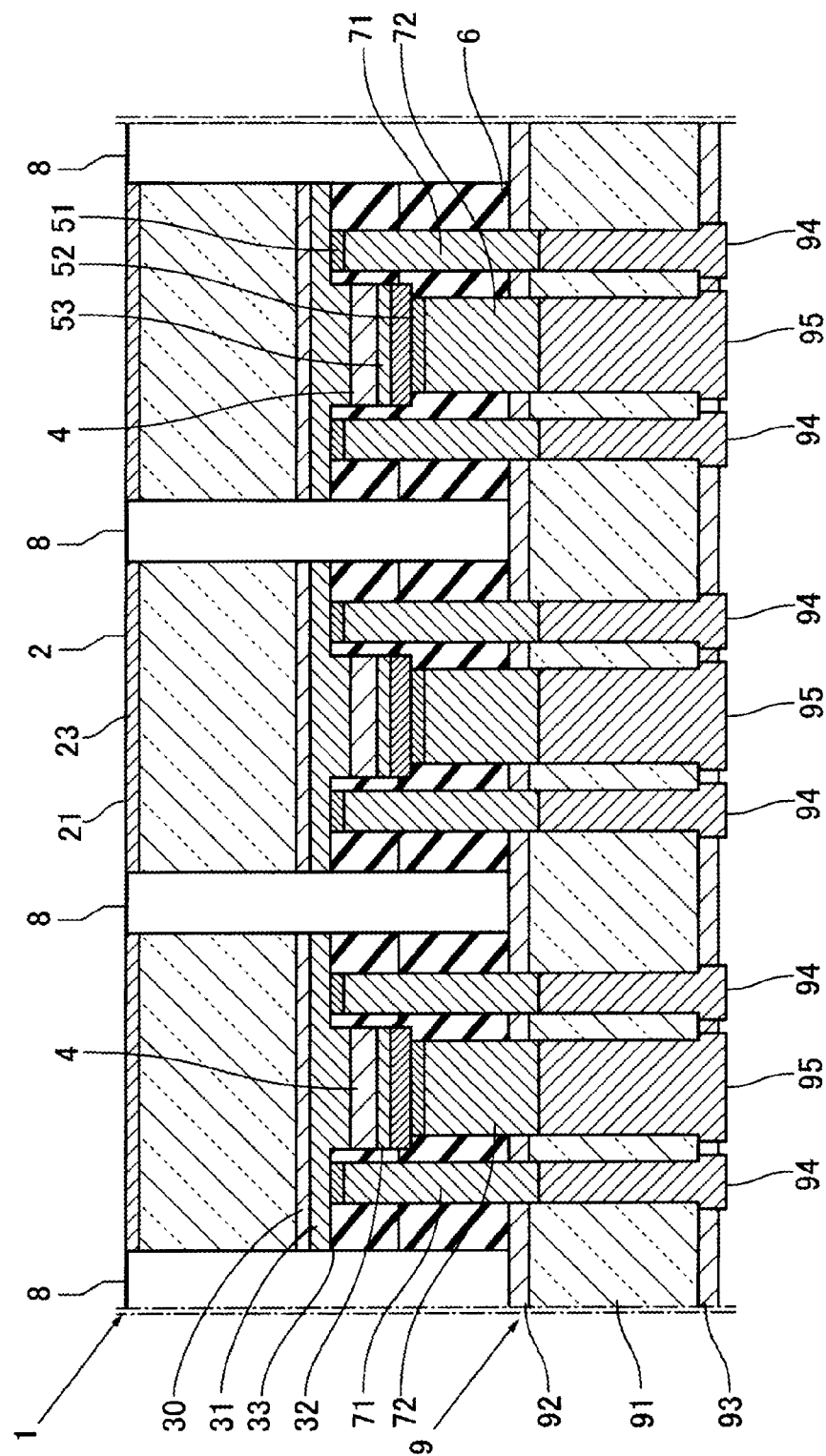
FIG. 21 is a partial sectional view of a light-emitting device according to still another embodiment of the present invention.

In the light-emitting device shown in FIG. 21, a transparent optical component 23 having small irregularities is disposed on the light-emitting surface 21 of the transparent crystal substrate 2. This enables the light-emitting surface 21 of the transparent crystal substrate 2 to diffuse or disperse light, achieving uniform surface light emission. Instead of providing the transparent optical component 23, small irregularities may be formed on the light-emitting surface 21 of the transparent crystal substrate 2. Although not shown in the figure, furthermore, a fluorescent body may be disposed on the light-emitting surface 21 of the transparent crystal substrate 2 along with or without the small irregularities.

The light-emitting device according to the present invention has a wide variety of applications such as a light-emitting diode being a single light-emitting element, a surface light-emitting device having a plurality of light-emitting elements arranged, for example, in the form of matrix, a lighting apparatus, a backlight for a liquid crystal display, a signal light and so on.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A light-emitting device comprising a plurality of light-emitting elements provided on a support substrate,
   each of the light-emitting elements comprising a transparent crystal substrate, a semiconductor layer, an insulating layer, vertical conductors, and through electrodes,
   the transparent crystal substrate having a light-emitting surface at one side thereof,
   the semiconductor layer having a multilayer structure having a p-type semiconductor layer and an n-type semiconductor layer and being disposed on the other side of the transparent crystal substrate opposite from the light-emitting surface,
   the insulating layer covering the semiconductor layer,
   the vertical conductors including a first vertical conductor and a second vertical conductor,
   the first vertical conductor having one end and the other end, the first vertical conductor passing through the insulating layer, said one end of the first vertical conductor connected to a first surface electrode provided on the n-type semiconductor layer,
   the second vertical conductor having one end and the other end, the second vertical conductor passing through the insulating layer, said one end of the second vertical conductor connected to a second surface electrode provided on the p-type semiconductor layer,
   the support substrate having a substrate part and the through electrodes and being disposed on the insulating layer,
   the through electrodes including a first though electrode and a second through electrode,
   the first through electrode having one end and the other end, said first through electrode passing through the substrate part, said one end of the first through electrode connected to the other end of the first vertical conductor,
   the second through electrode having one end and the other end, said second through electrode passing through the substrate part, said one end of the second through electrode connected to the other end of the second vertical conductor,
   the other end of the first vertical conductor being projected from a surface of the insulating layer and connected to said one end of the first through electrode inside the support substrate, and the other end of the second vertical conductor being projected from the surface of the insulating layer and connected to said one end of the second through electrode inside the support substrate,
   wherein the through electrodes and the vertical conductors are expansion metallic bodies containing a metallic component that expands upon solidification, the metallic component including Bi and at least one component selected from the group consisting of Ga, Sb, Ag, Cu, and Ge,
   wherein the expansion metallic bodies are formed by a molten metal filling process.

* * * * *